US009349672B2

(12) United States Patent
Mohammed et al.

(10) Patent No.: US 9,349,672 B2
(45) Date of Patent: May 24, 2016

(54) MICROELECTRONIC PACKAGE

(71) Applicant: Tessera, Inc., San Jose, CA (US)

(72) Inventors: Ilyas Mohammed, Santa Clara, CA (US); Belgacem Haba, Saratoga, CA (US); Sean Moran, Burlingame, CA (US); Wei-Shun Wang, Palo Alto, CA (US); Ellis Chau, San Jose, CA (US); Christopher Wade, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 110 days.

(21) Appl. No.: 13/661,927

(22) Filed: Oct. 26, 2012

(65) Prior Publication Data

US 2013/0249116 A1    Sep. 26, 2013

Related U.S. Application Data

(62) Division of application No. 11/894,036, filed on Aug. 16, 2007, now Pat. No. 8,299,626.

(51) Int. Cl.
*H01L 23/48* (2006.01)
*H01L 29/00* (2006.01)
(Continued)

(52) U.S. Cl.
CPC ............... *H01L 23/48* (2013.01); *H01L 23/13* (2013.01); *H01L 23/3121* (2013.01); *H01L 23/49811* (2013.01); *H01L 24/48* (2013.01); *H01L 24/49* (2013.01); *H01L 25/105* (2013.01);
(Continued)

(58) Field of Classification Search
USPC ............. 257/685–687, 690, 692, 777, E23.01
See application file for complete search history.

(56) References Cited

U.S. PATENT DOCUMENTS 4,878,611 A    11/1989    LoVasco et al.
5,138,438 A    8/1992    Masayuki et al.
(Continued)

FOREIGN PATENT DOCUMENTS

DE    10023823    12/2001
EP    0 615 283    9/1994
(Continued)

OTHER PUBLICATIONS

Chinese Office Action for Application No. 200780038511.0 dated Dec. 5, 2012.
(Continued)

*Primary Examiner* — Lynne Gurley
*Assistant Examiner* — Vernon P Webb
(74) *Attorney, Agent, or Firm* — Lerner, David, Littenberg, Krumholz & Mentlik, LLP

(57) ABSTRACT

A microelectronic package includes a lower unit having a lower unit substrate with conductive features and a top and bottom surface. The lower unit includes one or more lower unit chips overlying the top surface of the lower unit substrate that are electrically connected to the conductive features of the lower unit substrate. The microelectronic package also includes an upper unit including an upper unit substrate having conductive features, top and bottom surfaces and a hole extending between such top and bottom surfaces. The upper unit further includes one or more upper unit chips overlying the top surface of the upper unit substrate and electrically connected to the conductive features of the upper unit substrate by connections extending within the hole. The upper unit may include an upper unit encapsulant that covers the connections of the upper unit and the one or more upper unit chips.

21 Claims, 30 Drawing Sheets

(51) Int. Cl.
  H01L 23/13    (2006.01)
  H01L 23/31    (2006.01)
  H01L 23/498   (2006.01)
  H01L 23/00    (2006.01)
  H01L 25/10    (2006.01)

(52) U.S. Cl.
  CPC .......... H01L 2224/06135 (2013.01); H01L 2224/32145 (2013.01); H01L 2224/32225 (2013.01); H01L 2224/4824 (2013.01); H01L 2224/48091 (2013.01); H01L 2224/48227 (2013.01); H01L 2224/48465 (2013.01); H01L 2224/49431 (2013.01); H01L 2224/73215 (2013.01); H01L 2224/73265 (2013.01); H01L 2224/8592 (2013.01); H01L 2225/0651 (2013.01); H01L 2225/06555 (2013.01); H01L 2225/06562 (2013.01); H01L 2225/1023 (2013.01); H01L 2225/1058 (2013.01); H01L 2225/1088 (2013.01); H01L 2924/00014 (2013.01); H01L 2924/014 (2013.01); H01L 2924/01005 (2013.01); H01L 2924/01006 (2013.01); H01L 2924/01014 (2013.01); H01L 2924/01015 (2013.01); H01L 2924/01027 (2013.01); H01L 2924/01029 (2013.01); H01L 2924/01033 (2013.01); H01L 2924/01074 (2013.01); H01L 2924/01078 (2013.01); H01L 2924/01079 (2013.01); H01L 2924/01082 (2013.01); H01L 2924/1532 (2013.01); H01L 2924/15312 (2013.01); H01L 2924/15331 (2013.01); H01L 2924/1815 (2013.01); H01L 2924/3511 (2013.01)

(56) References Cited

U.S. PATENT DOCUMENTS

| | | |
|---|---|---|
| 5,222,014 A | 6/1993 | Lin |
| 5,247,423 A | 9/1993 | Lin et al. |
| 5,422,435 A | 6/1995 | Takiar et al. |
| 5,804,874 A | 9/1998 | An et al. |
| 5,883,426 A | 3/1999 | Tokuno et al. |
| 5,998,864 A | 12/1999 | Khandros et al. |
| 6,072,233 A | 6/2000 | Corisis et al. |
| 6,093,029 A | 7/2000 | Kwon et al. |
| 6,180,881 B1 | 1/2001 | Isaak |
| 6,268,649 B1 | 7/2001 | Corisis et al. |
| 6,335,565 B1 | 1/2002 | Miyamoto et al. |
| 6,445,594 B1 | 9/2002 | Nakagawa et al. |
| 6,765,287 B1 | 7/2004 | Lin |
| 8,288,862 B2 | 10/2012 | Khiang et al. |
| RE45,463 E | 4/2015 | Haba |
| 2002/0043709 A1 | 4/2002 | Yeh et al. |
| 2002/0053727 A1 | 5/2002 | Kimura |
| 2002/0074630 A1 | 6/2002 | Ando et al. |
| 2002/0121687 A1 | 9/2002 | Winderl |
| 2002/0190396 A1 | 12/2002 | Brand |
| 2003/0102546 A1 | 6/2003 | Lee et al. |
| 2003/0183930 A1 | 10/2003 | Fukasawa |
| 2004/0026773 A1 | 2/2004 | Koon et al. |
| 2004/0090759 A1 | 5/2004 | Kim |
| 2005/0104196 A1 | 5/2005 | Kashiwazaki |
| 2005/0284658 A1 | 12/2005 | Kubota et al. |
| 2005/0285246 A1 | 12/2005 | Haba et al. |
| 2006/0202317 A1 | 9/2006 | Barakat et al. |
| 2006/0290005 A1 | 12/2006 | Thomas et al. |
| 2007/0152310 A1* | 7/2007 | Osborn et al. ............... 257/678 |
| 2008/0136005 A1 | 6/2008 | Lee et al. |

FOREIGN PATENT DOCUMENTS

| | | |
|---|---|---|
| JP | 06-013541 A | 1/1994 |
| JP | 2001-223297 A | 8/2001 |
| JP | 2001-298150 A | 10/2001 |
| JP | 2002-076252 A | 3/2002 |
| JP | 2006-080564 A | 3/2006 |
| KR | 19990069438 A | 9/1999 |
| KR | 2001-0061886 A | 7/2001 |
| KR | 20020039012 A | 5/2002 |
| WO | 2007075678 | 7/2007 |

OTHER PUBLICATIONS

International Search Report, PCT/US2007/018521.
Korean Office Action for Application No. 10-2009-7005325 dated May 28, 2014.
Korean Office Action for Application No. 10-2009-7005325 dated Nov. 19, 2014.

* cited by examiner

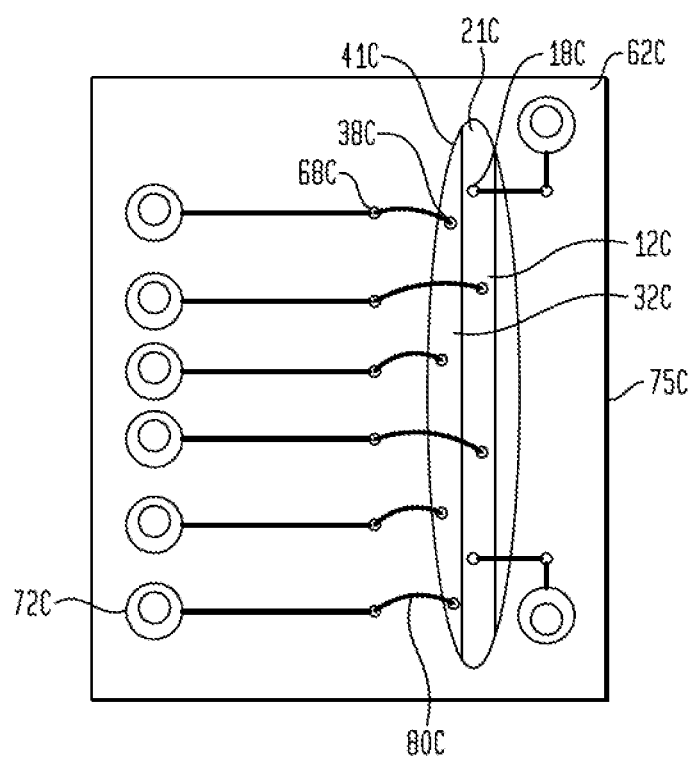

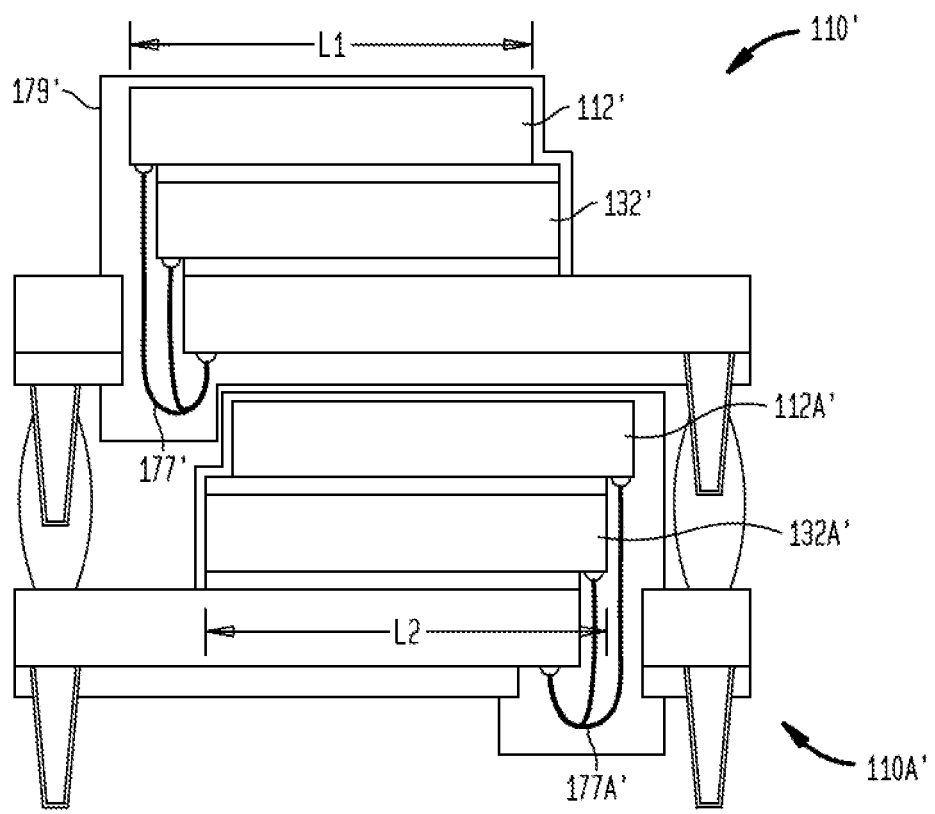

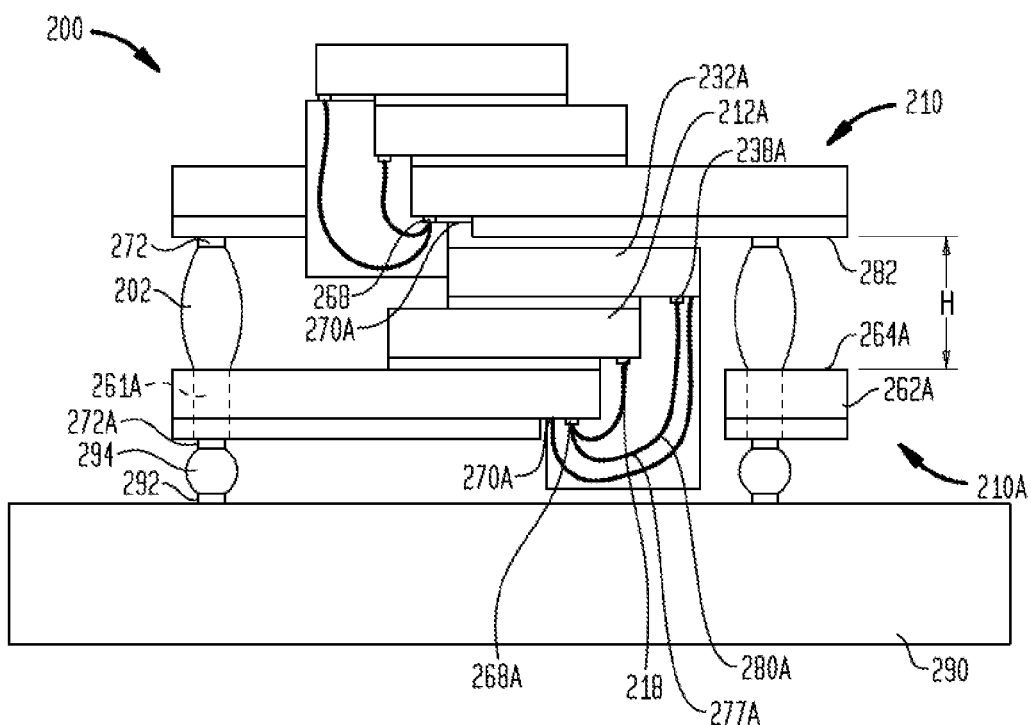

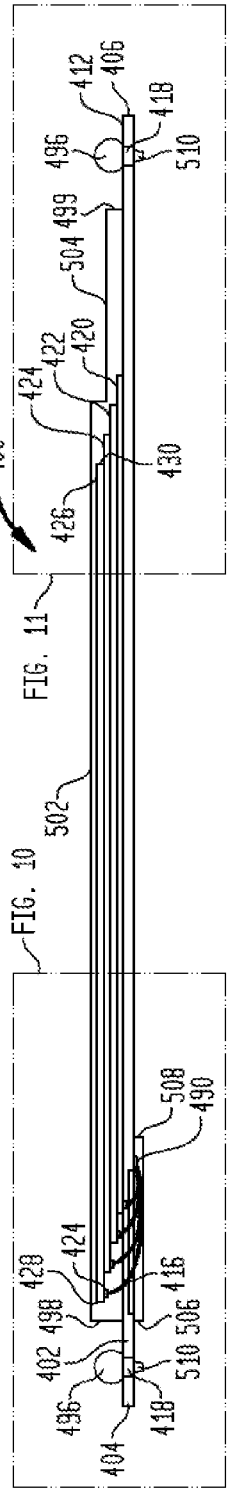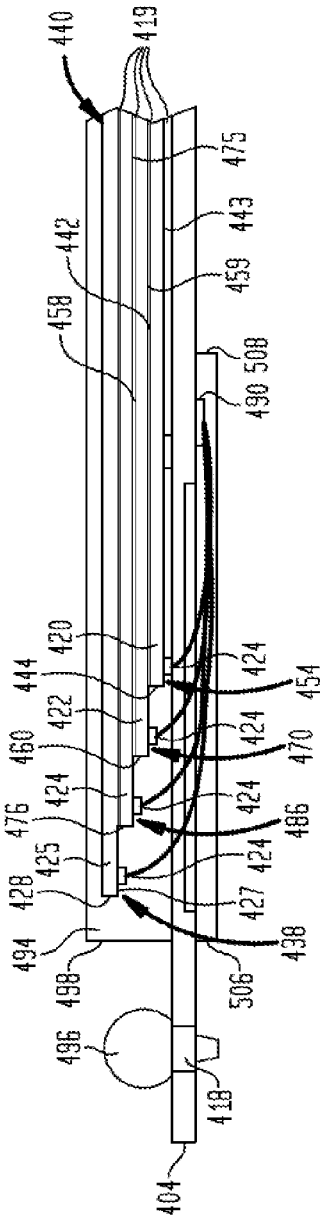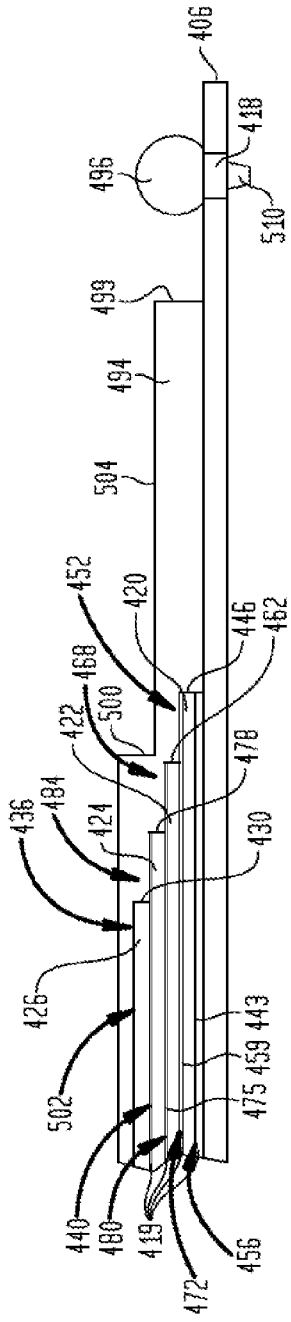

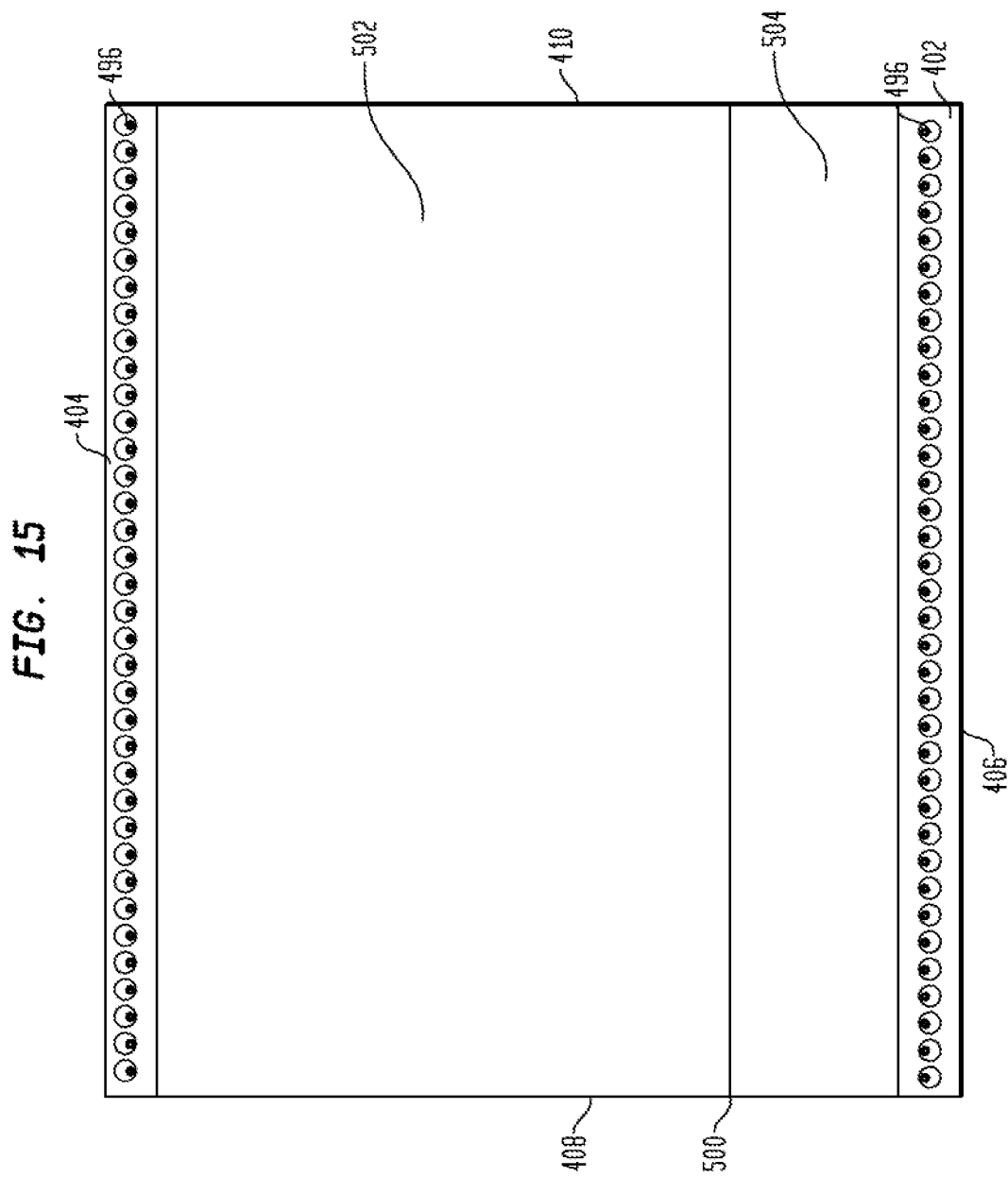

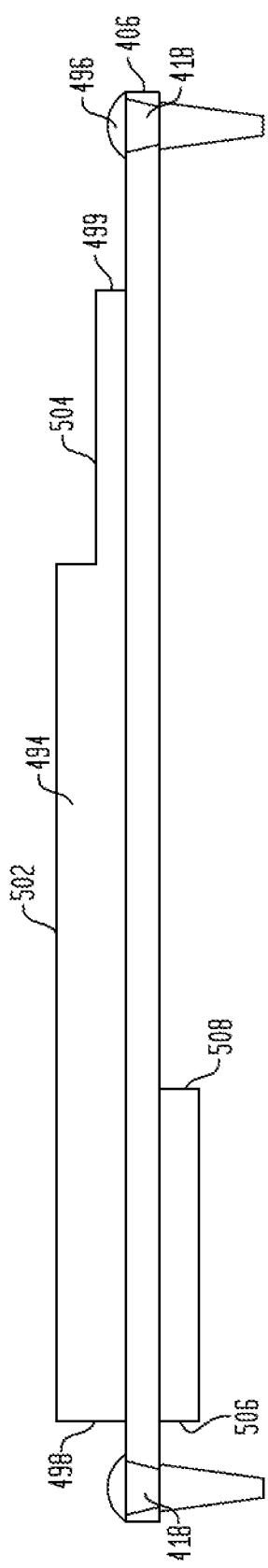

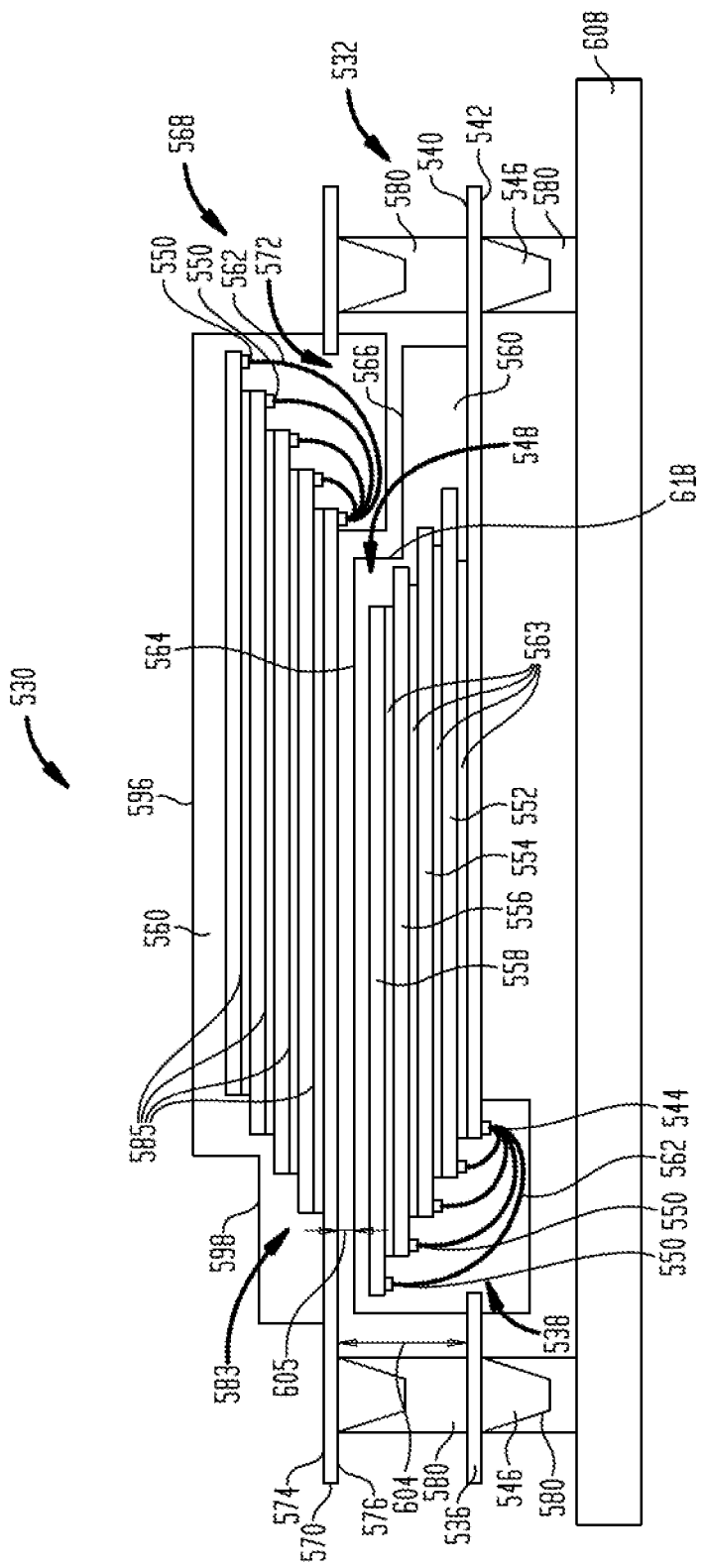

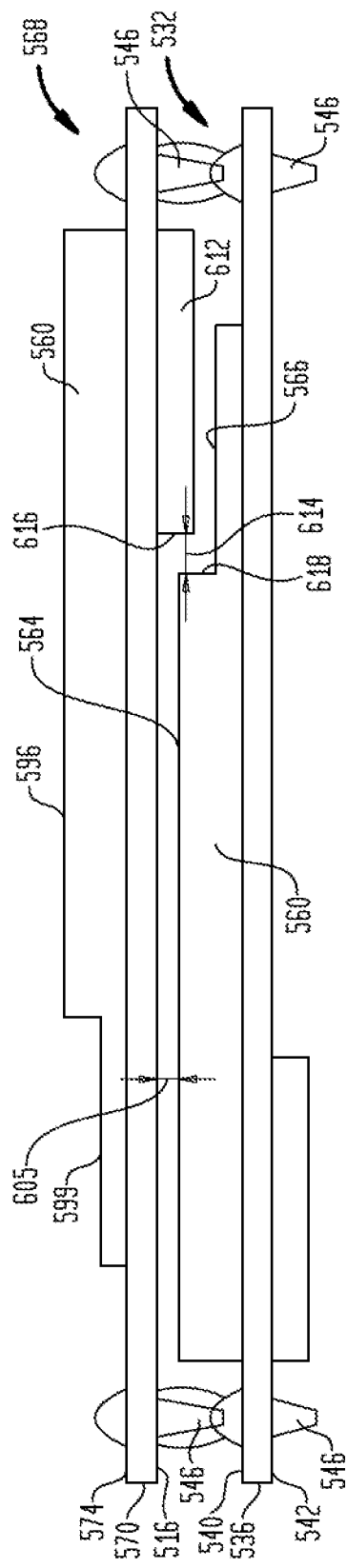

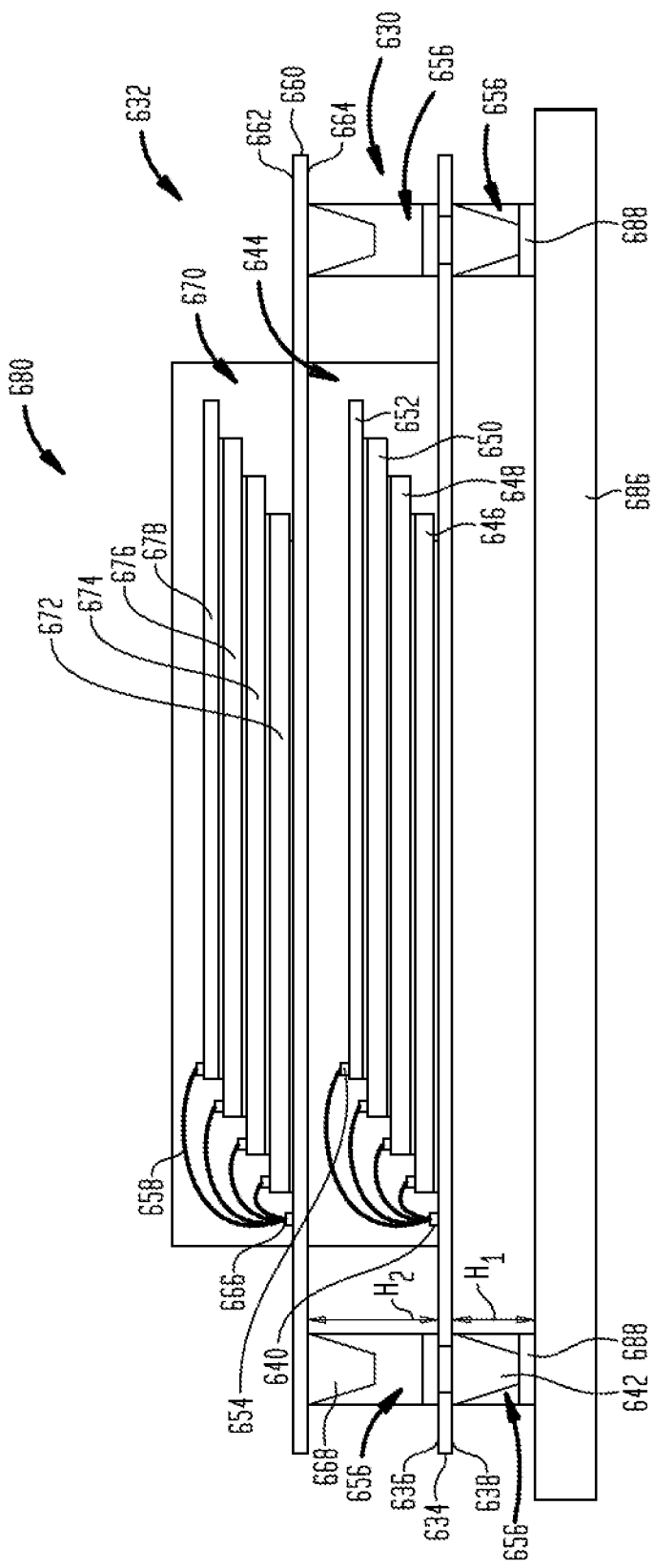

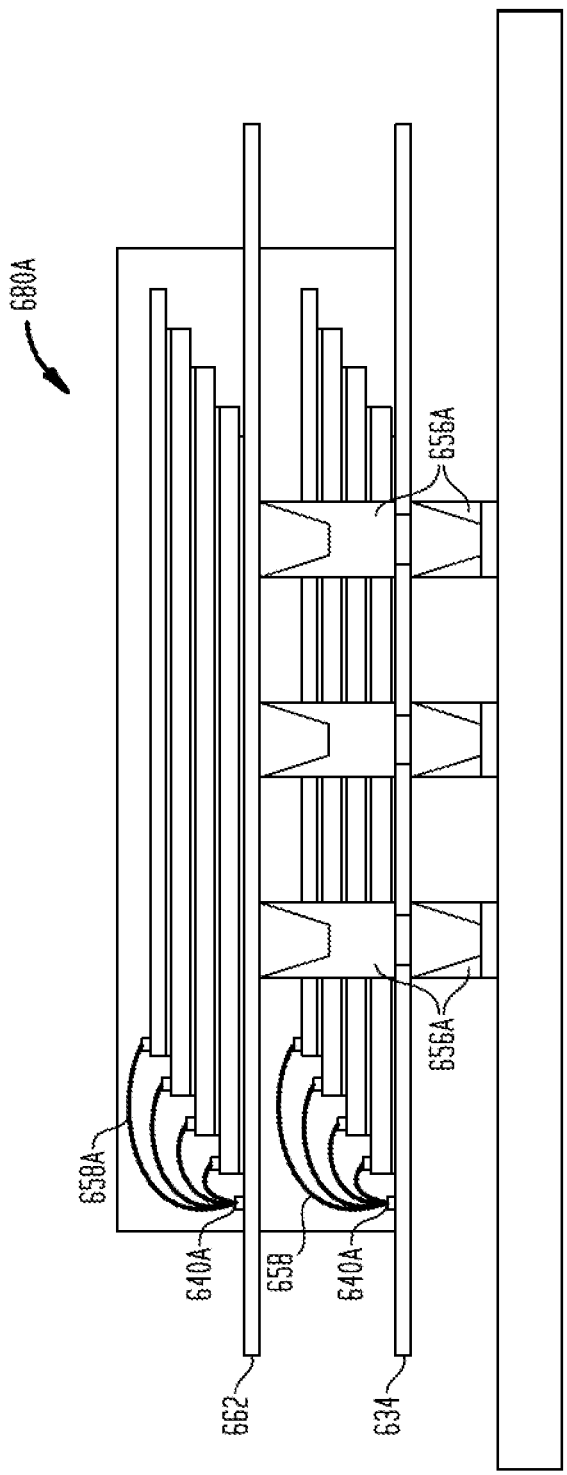

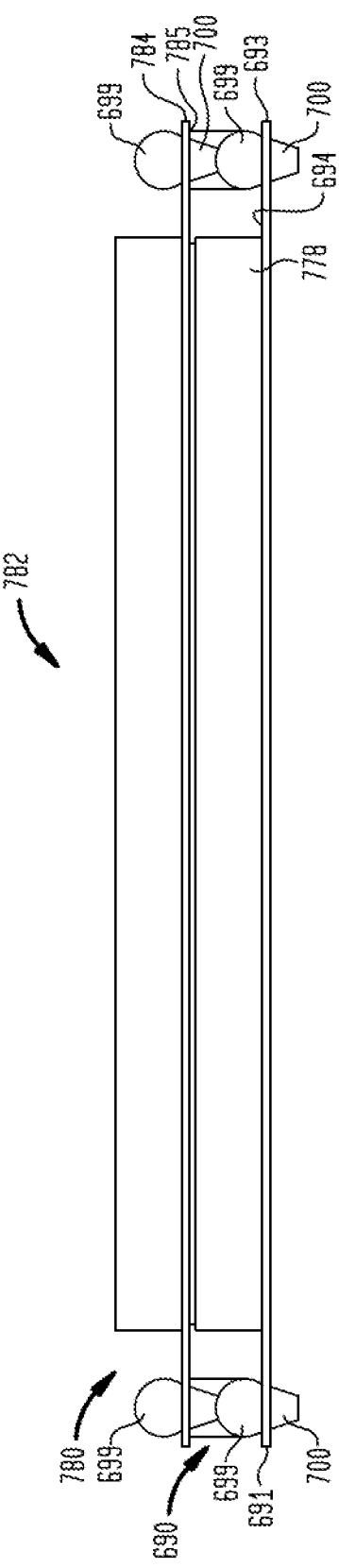

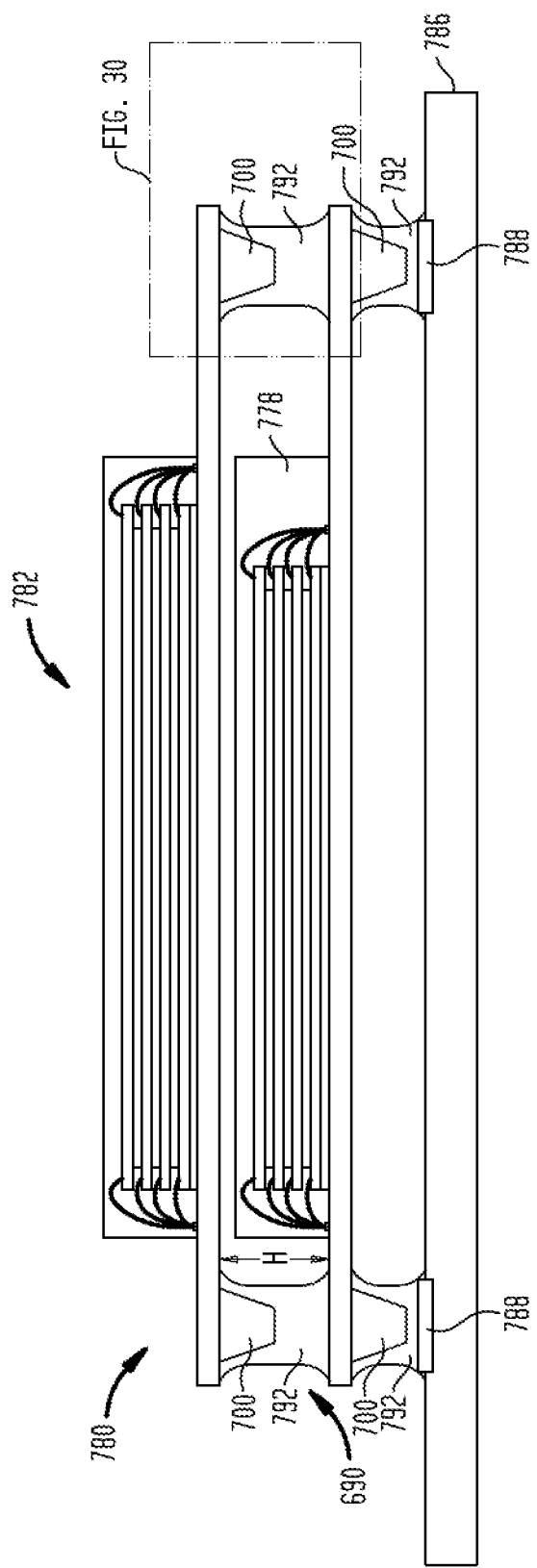

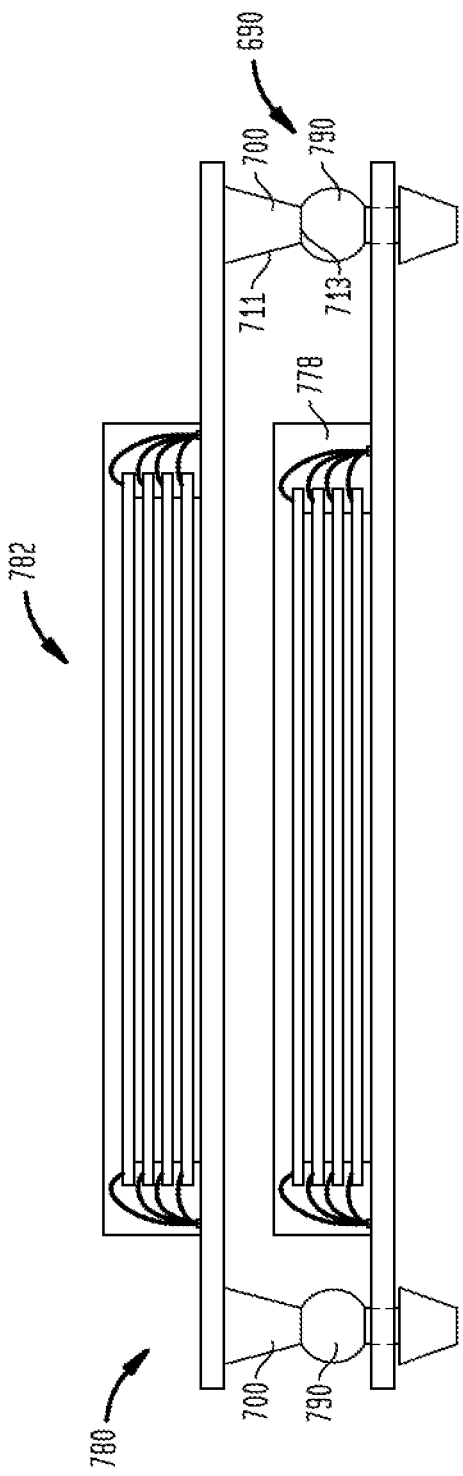

| PITCH (mm) | 0.3* | 0.4 | 0.5 |
|---|---|---|---|
| SOLDERBALL DIA. (mm) | 0.200 | 0.275 | 0.350 |
| PAD DIA. (mm) | 0.160 | 0.220 | 0.280 |

| STANDOFF (mm) | 0.3* | 0.4 | 0.5 |
|---|---|---|---|
| 0.100 | | | |
| 0.125 | | | |
| 0.150 | | | |
| 0.175 | | | |
| 0.200 | | | |
| 0.225 | 0.233 | | |
| 0.250 | | | |
| 0.275 | | | |
| 0.300 | | | |
| 0.325 | | 0.335 | |
| 0.350 | | | |
| 0.375 | | | 0.392 |
| 0.400 | | | |
| 0.425 | | | |

FIG. 29

| PITCH (mm) | 0.3 | 0.4 | 0.5 |
|---|---|---|---|
| SOLDERBALL DIA. (mm) | 0.200 | 0.275 | 0.350 |
| PAD DIA. (mm) | 0.160 | 0.220 | 0.280 |
| STANDOFF (mm) 0.100 | | 0.117 | |
| 0.125 | | | |
| 0.150 | | | 0.169 |
| 0.175 | | | |
| 0.200 | | | |
| 0.225 | | | 0.220 |
| 0.250 | | | |
| 0.275 | | | |
| 0.300 | | | |
| 0.325 | | | |
| 0.350 | | | |
| 0.375 | | | |
| 0.400 | | | |
| 0.425 | | | |

FIG. 30

| PITCH (mm) | 0.3* | 0.4 | 0.5 |
|---|---|---|---|
| SOLDERBALL DIA. (mm) | 0.200 | 0.275 | 0.350 |
| PAD DIA. (mm) | 0.150 | 0.206 | 0.263 |
| STANDOFF (mm) 0.100 | | | |
| 0.125 | | | |
| 0.150 | | | |
| 0.175 | | | |
| 0.200 | | | |
| 0.225 | | | |
| 0.250 | 0.264 | | |
| 0.275 | | | |
| 0.300 | | | |
| 0.325 | | 0.345 | |
| 0.350 | | | |
| 0.375 | | | |
| 0.400 | | | 0.409 |
| 0.425 | | | |

MICROELECTRONIC PACKAGE

CROSS-REFERENCE TO RELATED APPLICATION

The present application is a divisional of U.S. patent application Ser. No. 11/894,036, filed on Aug. 16, 2007, the disclosure of which is incorporated herein by reference.

BACKGROUND OF THE INVENTION

The present invention relates to microelectronic apparatuses and methods for making microelectronic components for microelectronic packages and assemblies.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Certain types of packages have been developed, which utilize a microelectronic component having a dielectric substrate having conductive traces disposed thereon. In such an arrangement, electrically conductive posts or pillars project from a surface of the substrate. Each post is connected to a portion of one of the traces. This type of microelectronic component is particularly useful in chip packages having arrangements that allow each post to move independently of the other posts. The movement of the posts allows the tips of the plural post to simultaneously engage contact pads on a circuit board despite irregularities in the circuit board or the package, such as warpage of the circuit board. Additionally, this facilitates testing of the package using simple test boards that may have substantially planar contacts, and avoids the need for specialized, expensive test sockets.

This type of microelectronic component has various applications and can be used in a number of different microelectronic package arrangements. As disclosed in certain preferred embodiments of U.S. patent application Ser. Nos. 11/014,439; 10/985,119; and 10/985,126, the disclosures of which are incorporated by reference herein, one such microelectronic package can include a microelectronic element such as a semiconductor chip and a microelectronic component comprising a substrate spaced from and overlying a first face of the microelectronic element. Such a component can include a plurality of conductive posts extending from the substrate and projecting away from the microelectronic element, at least some of the conductive posts being electrically interconnected with the microelectronic element. Additionally, such a package can include a plurality of support elements disposed between the microelectronic element and the substrate and supporting the substrate over the microelectronic element. At least some of the conductive posts may be offset in horizontal directions parallel to the plane of the substrate from the support elements. For example, the support elements may be disposed in an array with zones of the substrate disposed between adjacent support elements, and the posts may be disposed near the centers of such zones.

The dielectric substrate utilized in such a microelectronic component can be made from a material such as a polyimide or other polymeric sheet. It includes a top surface and a bottom surface remote therefrom. Although the thickness of the dielectric substrate will vary with the application, the dielectric substrate most typically is about 10 m-100 m thick. The sheet has conductive traces thereon. In one embodiment the conductive traces are disposed on the bottom surface of the sheet. However, in other embodiments, the conductive traces may extend on the top surface of the sheet; on both the top and bottom faces or within the interior of substrate. Conductive traces may be formed from any electrically conductive material, but most typically are formed from copper, copper alloys, gold or combinations of these materials. The thickness of the traces will also vary with the application, but typically is about 5 m-25 m. Traces are arranged so that each trace has a support end and a post end remote from the support end. The dielectric sheet, traces and posts can be fabricated by a process such as that disclosed in co-pending, commonly assigned U.S. patent application Ser. No. 10/959,465, the disclosure of which is incorporated by reference herein. As disclosed in greater detail in the '465 Application, a metallic plate is etched or otherwise treated to form numerous metallic posts projecting from the plate. A dielectric layer is applied to this plate so that the posts project through the dielectric layer. An inner side of the dielectric layer faces toward the metallic plate, whereas the outer side of the dielectric layer faces towards the tips of the posts. Previously this dielectric layer has been fabricated by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the sheet in any suitable manner, which connects the posts to the traces.

Despite these advances in the art, still further improvements in making microelectronic components would be desirable.

SUMMARY OF THE INVENTION

In accordance with an aspect of the present invention, a microelectronic package may include a lower unit having a lower unit substrate with conductive features and a top and bottom surface. The lower unit may include one or more lower unit chips overlying the top surface of the lower unit substrate that are electrically connected to the conductive features of the lower unit substrate. An upper unit of the microelectronic package may include an upper unit substrate having conductive features, top and bottom surfaces and a hole extending between such top and bottom surfaces. The upper unit may further include one or more upper unit chips overlying the top surface of the upper unit substrate and electrically connected to the conductive features of the upper unit substrate by connections extending within the hole. The upper unit substrate may be disposed over the lower unit chips and the hole such that the connections of the upper unit are offset in a first horizontal direction from the lower unit chips.

The microelectronic package may also include electrically conductive connections electrically connecting the conductive features of the upper unit substrate and the lower unit substrate. The conductive connections may define a pattern, and the hole of the upper unit can be offset in the first horizontal direction relative to the pattern. The one or more lower unit chips may be offset relative to the pattern in a second horizontal direction opposite to the first horizontal direction.

The lower unit may have a hole extending between the top and bottom surfaces of the lower unit substrate such that the one or more lower unit chips are electrically connected to conductive features of the lower unit substrate by connections extending through the hole in the lower unit substrate. The lower unit substrate may also be offset relative to the pattern of the conductive connections in the second horizontal direction.

The microelectronic package may also have an upper unit encapsulant that one or more of the upper unit chips and a lower unit encapsulant that covers the connections of the lower unit, as well as one or more lower unit chips. The upper and lower unit encapsulants may be disposed over the upper and lower unit chips and connections such that one or more steps are created. One of the steps of said upper unit may be adjacent one of the steps of the lower unit.

There may also be four upper unit chips of the microelectronic package. Each of the upper unit chips may have an edge with a wire lead extending across each of the edges of the four chips to the conductive features of the upper unit substrate.

In an alternate embodiment, the package may include a first microelectronic element having a plurality of contacts and a second microelectronic element having a plurality of contacts. The first microelectronic element being positioned over the second microelectronic element. And a dielectric element having a first face, a second face and a hole extending from the first face to the second face. The dielectric element further including conductive features exposed at the second face, and the second microelectronic element being positioned above said dielectric element.

The package also may include a first set of connection elements extending between the plurality of contacts of the first microelectronic element and at least some of the conductive features of the dielectric element. A second set of connection elements extending between the plurality of contacts of the second microelectronic element and at least some of the conductive features of the dielectric element. At least some of the first set of connection elements and at least some of the second set of connection elements extend through the hole of the dielectric element.

The microelectronic package may also have an encapsulant disposed over the connections extending within the hole. The encapsulant may be dispersed over both the microelectronic elements and the connection as an overmold. The height of the encapsulant or overmold at the connections may be greater than a height of the encapsulant over the microelectronic elements. For example, the height of the encapsulant at the microelectronic element may be at least 50 microns less than the height of the encapsulant over the connection elements.

The microelectronic package may also include a third microelectronic element positioned over the second microelectronic element, and a fourth microelectronic element positioned over the third microelectronic element. The dielectric element may also have an outer edge, and each of the first, second, third and fourth microelectronic elements may also have an edge. The edge of the fourth microelectronic element may be more proximate the outer edge of the dielectric element than the edges of the first, second, and third microelectronic elements.

In another aspect of the present invention, a microelectronic package comprises a first unit including a first unit substrate that has conductive features and a top and bottom surface. The first unit includes one or more first unit chips overlying the top surface of the first unit substrate that are electrically connected to the conductive features of the first unit substrate. There is also a second unit including a second unit substrate having conductive features and top and bottom surfaces. The second unit further includes one or more second unit chips overlying the top face of the second unit substrate and electrically connected to the conductive features of the second unit substrate by connections extending from the second unit chips to the conductive features. The second unit substrate is disposed over the first unit chips, and the connections of the second unit are offset in a first horizontal direction from the first unit chips. The first unit may include a first unit encapsulant covering the connections of the first unit and the one or more first unit chips.

The encapsulant at the height of the connection elements may be greater than the height of at least a portion of the encapsulant covering the microelectronic elements. For example, the height of the encapsulant at the microelectronic elements may be at least 50 microns less than the height of the encapsulant over the connection elements, such as wire leads.

The contact-bearing faces of the first unit chips may face upward away from the top surface of the first unit substrate or downward toward the top surface of the first unit substrate.

In another aspect of the present invention, a method of manufacturing a microelectronic package is provided. In one embodiment, the method includes attaching a first chip to a second chip such that a first portion of the first chip extends outwardly beyond a first portion of the second chip. And attaching the second chip to a first face of a substrate. The substrate having an oppositely facing second face that includes conductive elements and at least one hole extending therethrough. The method may also include electrically connecting the first chip and the second chip to the conductive elements of the substrate via connection elements. At least one connection element electrically connecting the first chip to the conductive elements and at least one connection element electrically connecting the second chip to the conductive elements extending through a common hole of the substrate.

In another aspect of the present invention, a method of manufacturing a microelectronic package includes preparing a first unit including a first substrate having conductive features, a top surface and bottom surface remote from the top surface. The first unit may include one or more first unit chips overlying the top surface of the first unit substrate. A second unit can be prepared which may include a second unit substrate having conductive features, a top surface and a bottom surface remote from the top surface. A hole may extend between such top and bottom surfaces. The second unit may further include one or more second unit chips overlying the top surface of the second unit substrate. The second unit chips can be electrically connected to the conductive features of the second unit substrate with connection elements. The second unit can then be joined to the first unit such that the hole and the connections of the second unit are offset in a first horizontal direction from the first unit chips.

In accordance with another aspect of the invention, a method is provided for forming a conductive interconnection between first and second interconnect elements. In such method, a conductive post extending from the first interconnect element is joined with a conductive pad of the second interconnect element by molten solder. The solder may then be allowed to elongate in a direction aligned with the height of the conductive post of the first interconnect element.

In a particular example, a height of the conductive interconnection may be at least one and one-half times a diameter of the conductive pad.

In accordance with one aspect of the invention, a method is provided for conductively interconnecting first and second substrates through a conductive column. A conductive post protruding away from a major surface of a first substrate is joined to a conductive feature exposed at a major surface of a second substrate through a column of solder that wets a wall of the conductive post. The conductive column has a width W at an end adjacent to the second substrate and a width M at a midpoint between the first and second substrates. In one aspect of the invention, a ratio of the width M to the width W is less than 1.2.

In accordance with one aspect of the invention, a method is provided for conductively interconnecting first and second substrates through conductive columns. In such method, first bumps protruding from a major surface of a first substrate are aligned with respective second bumps which protrude from a major surface of a second substrate towards the first bumps, where each of the first and second bumps includes a solder. The first and second bumps and fused into conductive columns such as by heating, where each column has a width W at an end adjacent to the second substrate and a width M at a midpoint between the first and second substrates. In accordance with a particular aspect of the invention, a ratio of the width M to the width W is less than 1.2.

In accordance with a particular aspect of the invention, each of the first and second bumps can include a solder paste. In one aspect of the invention, each of the first and second bumps consists essentially of solder.

In accordance with one aspect of the invention, a method is provided for conductively interconnecting first and second substrates through conductive columns. In such method, exposed columns protruding from a first face of a first substrate are joined with features exposed at a second face of a second substrate that confronts the first face, where each exposed column includes a solder paste. The exposed columns are fused to the exposed features such as by heating to form conductive columns interconnecting the first and second substrates. Each such column has a width W at an end adjacent to the second substrate and a width M at a midpoint between the first and second substrates, wherein a ratio of the width M to the width W is less than 1.2. In a particular embodiment, the exposed features of the second substrate include columns which protrude from the second face, such columns also including a solder paste.

In accordance with another aspect of the invention, a microelectronic assembly is provided which includes a first wiring element having a top surface defining a first plane. A second wiring element has a bottom surface that defines a second plane other than the first plane, the bottom surface confronting the top surface of the first wiring element. One or both of the first or second wiring elements can include a plurality of conductive pads exposed at one of the confronting surfaces. In a particular embodiment, a microelectronic element may be conductively connected to one or both of the first or second wiring elements.

A plurality of conductive columns connect the first wiring element with the second wiring element. The conductive columns include conductive posts protruding in a direction of at least one of i) from the first wiring element towards the pads of the second wiring element or ii) from the second wiring element towards the pads of the first wiring element. The columns may further include a solder overlying the conductive posts. The solder may join the conductive posts of at least one of the first or second wiring elements with pads exposed at the confronting surface of the at least one of the first or second wiring elements. In one embodiment, a height of each column is greater than a height of the conductive post included in such column.

In accordance with a particular aspect of the invention, one or both of the first or second wiring elements may further include traces which extend from the pads in a direction of the first or second planes defined by such wiring element. In a particular example, the width of each pad can be less than the height of each column.

In accordance with a particular aspect of the invention, each column may be joined at a top end to the second wiring element and may be joined at a bottom end to the first wiring element. A waist width of such column at a position between the top and bottom ends may be less than 1.2 multiplied by a width of such column at the top end. In addition, the waist width of such column may be less than 1.2 multiplied by a width of such column at the bottom end.

In accordance with a particular aspect of the invention, the conductive posts may be arranged at a pitch with the height being greater than half the pitch.

In accordance with another aspect of the invention, a microelectronic assembly is provided. A first wiring element of such assembly may have a top surface which defines a first plane and a plurality of first conductive pads exposed at the top surface. A second wiring element may have a bottom surface which defines a second plane other than the first plane, the bottom surface confronting the top surface of the first wiring element. A plurality of second conductive pads may be exposed at the bottom surface. A microelectronic element may be conductively connected to at least one of the first or second wiring elements. Conductive columns each including a solder may connect ones of the first conductive pads with respective ones of the second conductive pads.

In accordance with a particular aspect of the invention, each column may have a width M at a midpoint between the first and second conductive pads. A height H of each column between the first and second conductive pads may be greater than the width M.

In accordance with a particular aspect of the invention, a height of each column between the first and second conductive pads may be greater than half a pitch of the first conductive pads included in the conductive columns.

In one aspect of the invention, at least one of the first or second wiring elements further includes traces extending along a respective plane defined by such wiring element from a respective one of the conductive pads of such wiring element.

In a particular aspect of the invention, the width of each conductive pad may be less than the height of each column.

In a particular aspect of the invention, each column may be joined at a bottom end to one of the first conductive pads and joined at a top end to one of the second conductive pads. Each such column has a width M at a midpoint between the top and bottom ends and a width W at the bottom end. In a particular aspect of the invention, a ratio of the width M to the width W is less than 1.2.

BRIEF DESCRIPTION OF THE DRAWINGS

FIGS. 5B-5C are bottom views of additional embodiments in accordance with the present invention;

FIG. 6B is a cross-sectional view of an alternative embodiment of the present invention.

FIG. 7 is a cross-sectional view of an alternative embodiment in accordance with the present invention; and FIG. 8 is a cross-sectional view of an alternative embodiment in accordance with the present invention.

FIG. 9 is a cross-sectional view of an alternative embodiment of the present invention.

FIG. 10 is an exploded view of a portion of FIG. 9.

FIG. 11 is an exploded view of another portion of FIG. 9.

FIG. 15 is a top plan view of the alternative embodiment of FIG. 9.

FIG. 16 is a plan view of a portion of the alternative embodiment of FIG. 9.

FIG. 17 is a cross-section view of an alternative embodiment in accordance with the present invention.

FIG. 18 is a plan view of a portion of the alternative embodiment of FIG. 17.

FIG. 19 is a cross-sectional view of another alternative embodiment in accordance with the present invention.

FIG. 19A is a cross-sectional view of an alternative embodiment in accordance with the present invention.

FIG. 25 is a side plan view of the alternative embodiment shown in FIG. 23.

FIG. 26 is a cross sectional view of another alternative embodiment in accordance with the present invention.

FIG. 26A is a cross-sectional view of FIG. 26 just prior to assembly in accordance with an embodiment of the present invention.

FIG. 29 is a chart illustrating how the creation of a conductive column in accordance with the present invention provides for greater standoffs and reduced pitch.

FIG. 30 is a chart illustrating how reducing the size of the diameter of a conductive pad in accordance with the present invention can affect the standoff of a conductive column.

DETAILED DESCRIPTION

Figure 1:
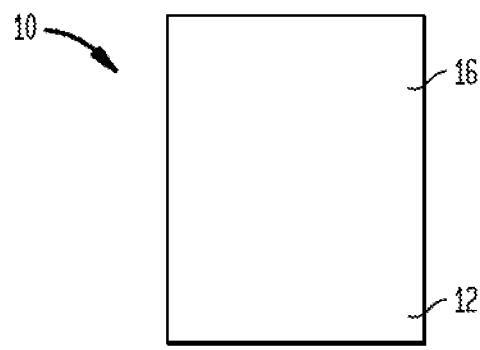
FIG. 1 is a top view of a first component used in conjunction with the present invention.
Figure 2:
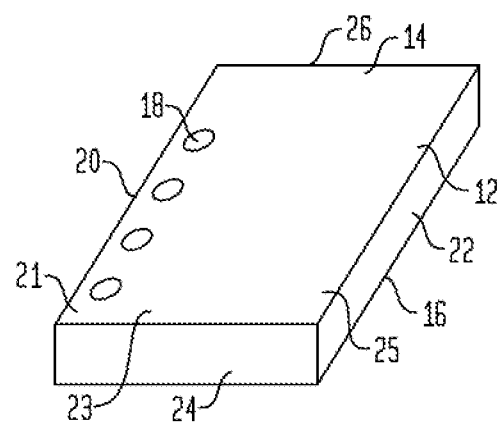
FIG. 2 is a bottom perspective view of the component of FIG. 1.

A microelectronic package 10, in accordance with one embodiment of the present invention, includes a microelectronic element, such as semiconductor chip 12 shown in FIGS. 1 and 2. The chip 12 includes a first or contact bearing surface 14 and an oppositely facing second surface 16. The chip 12 also includes a plurality of edges extending between the first surface 14 and the second surface 16, including first edge 20 and oppositely facing second edge 22, as well as third edge 24 and oppositely facing fourth edge 26. Additionally, the first surface 14 of the chip 12 includes a contact portion 21 adjacent first edge 20, a remote portion 25 adjacent second edge 22, and a central portion 23 positioned between the contact portion and the remote portion. A plurality of contacts 18 are exposed at the contact portion 21 to enable the chip 12 to be electrically connected to other devices as will be described below.

In one aspect of the present invention, as shown in FIG. 2, the contacts 18 are disposed proximate the first edge 20 and remote from second edge 22. The contacts 18 are also disposed in the contact portion 21 of the chip 12. Although not shown in the figure, a passivation layer may be formed over the first surface 14 of the chip 12 with openings positioned adjacent contacts 18, such that the contacts are exposed.

Figure 3:
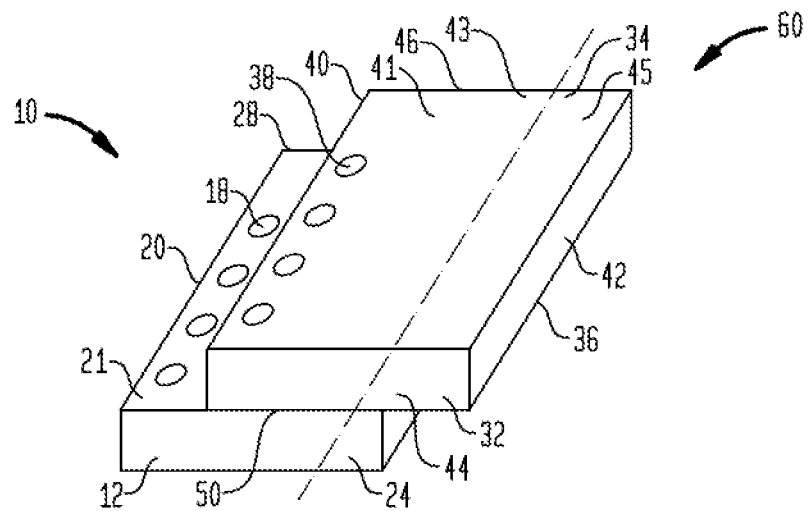
FIG. 3 is a bottom perspective view of the component of FIGS. 1 and 2 at a later stage of assembly.

Referring to FIG. 3, the microelectronic package 10 includes a second microelectronic element, such as a semiconductor chip 32, which is similar to chip 12. Chip 32 may include a first surface 34 bearing electrical contacts such as contacts 38 exposed there at. Chip 32 also includes an oppositely facing second surface 36. And similar to chip 12, chip 32 includes a first edge 40, a second edge 42, a third edge 44, and a fourth edge 46, each extending between and connecting the first surface 34 to the second surface 36 of chip 32. The first surface 34 of chip 32 also includes a contact portion 41 adjacent first edge 40, a remote portion 45 adjacent second edge 42 and a central portion 43 positioned between the contact portion and the remote portion. The contacts 38 are positioned adjacent first edge 40 in the contact portion 41 of the chip 32.

In a method of assembly, the two chips, 12 and 32 are brought proximate to one another and stacked one upon the other such that the second surface 36 of chip 32 confronts the first surface 14 of chip 12. Chip 12 may be attached to the chip 32 using an encapsulant material 50 such as an epoxy, to thereby hold the chips relative to one another.

The chip 32 is positioned onto chip 12 such the respective contact portions 21, 41 of the chips are not encumbered. For instance, as shown in FIG. 3, the first edge 40 of chip 32 is positioned within the central portion 23 of chip 12. The first edge 40 of chip 32 may be parallel with first edge 20 of chip 12 when the chips are placed in position. In this configuration, the contact portion 41 of chip 32 overlies the central portion 23 of chip 12. And the central portion 43 of chip 32 overlies the remote portion 25 of chip 12. The remote portion 45 of chip 32 extends outwardly beyond second edge 22 of chip 12. By placing the first edge 40 of chip 32 in line with the central portion 23 of chip 12, an "off-set stack" or "staircase" configuration is achieved. This off-set stack configuration enables both the contacts 18 of chip 12 and contacts 38 of chip 32 to be exposed at their respective surfaces without being encumbered by additional objects. This allows the contacts 18, 38 to be electrically connected to additional devices, as will be described below. The combination of chip 12 and chip 32 connected together forms a subassembly 60.

Figure 4:
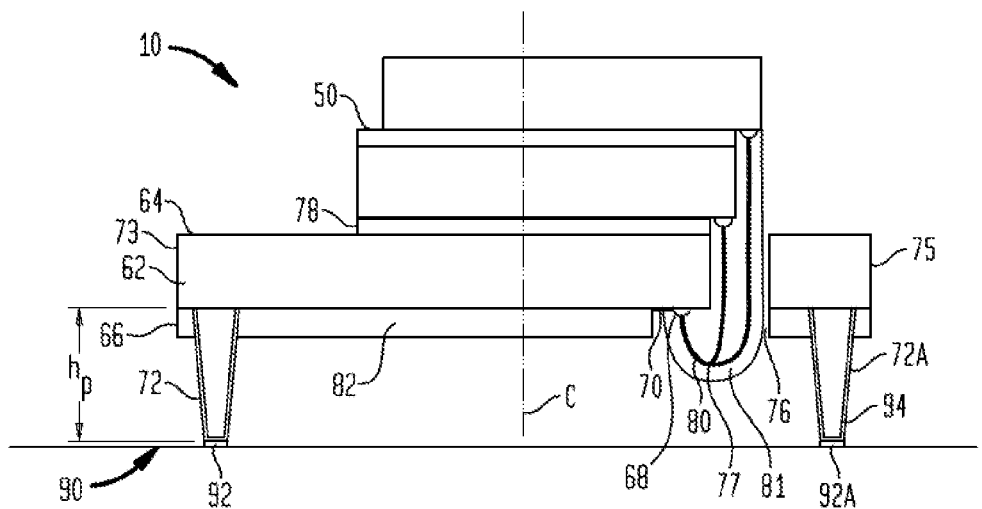
FIG. 4 is a cross-sectional view of a stacked package according to one embodiment of the present invention.

Referring to FIG. 4, the microelectronic package 10 includes a substrate such as dielectric element 62 that has a first surface 64 and an oppositely facing second surface 66. The dielectric element 62 may be rigid or flexible. The dielectric element 62 may be comprised of a polyimide or other polymeric sheet. Although the thickness of the dielectric element may vary, the dielectric element most typically is about 10μ-100μ thick. The dielectric element 62 may include a plurality of conductive elements such as bond pads 68, traces 70, and conductive posts 72. The bond pads 68, traces 70, and conductive posts 72 may be created using the methods illustrated in commonly assigned U.S. Published application Ser. No. 11/014,439, the disclosure of which is hereby incorporated by reference herein. In the particular embodiment illustrated, the conductive elements are disposed on the second surface 66 of dielectric element 62. However, in other embodiments, the conductive elements may extend on the first surface 64 of dielectric element 62; on both the first and second surfaces or within the interior of the dielectric element. Thus, as used in this disclosure, a statement that a first feature is disposed "on" a second feature should not be understood as requiring that the first feature lie on a surface of the second feature. Additionally, descriptive words such as "top," "bottom," "upper," and "lower" are used only for illustration purposes.

At least some of the bond pads 68 are electrically connected to at least some of the traces 70, which in turn are electrically connected to at least some of the conductive posts 72. This creates a plurality of continuous lines of electrically connected elements, thereby electrically connecting each of the elements within each continuous line. Bond pads 68, traces 70 and conductive posts 72 may be formed from any electrically conductive material, but most typically are formed from copper, copper alloys, gold or combinations of these materials. The thickness of the bond pads 68 and traces 70 will vary but typically are about 5μ-25μ. The conductive posts 72 extend downwardly from the dielectric element 72. The dimensions of the conductive posts 72 can vary over a significant range, but most typically the height $h_p$ of each conductive post below the second surface 66 of the dielectric element 62 sheet is about 50-300μ.

Figure 5A:
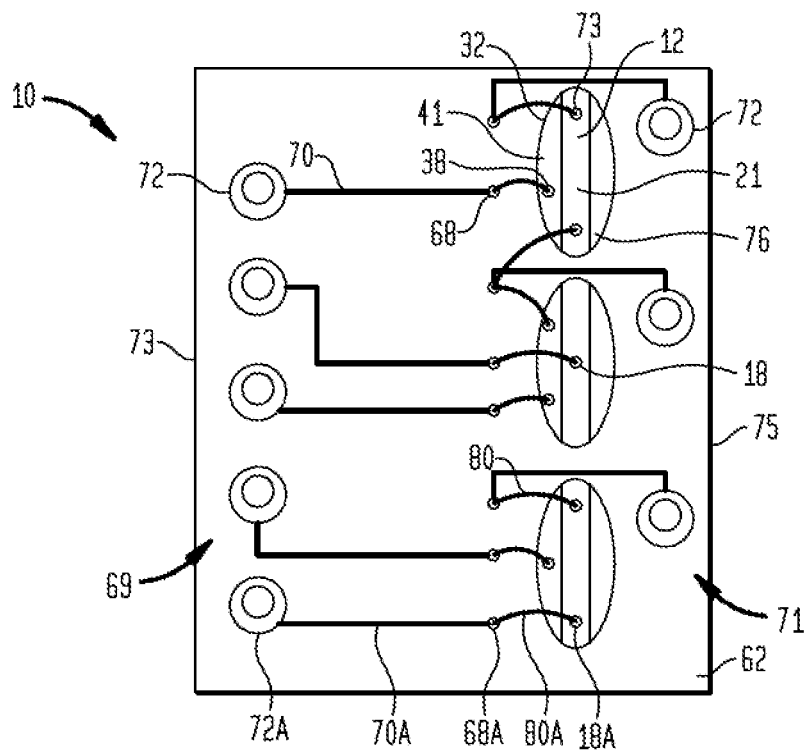
FIG. 5A is a bottom view of the embodiment illustrated in FIG. 4.

Dielectric element 62 may include a plurality of holes 76, as shown in FIGS. 4 and 5A, extending from the first surface 64 of the dielectric element to the second surface 66. In one aspect of the present invention, the subassembly 60 is attached to the dielectric element 62 such that the contact portions 21, 41 of the respective chips 12, 32 are aligned with the holes 76 of the dielectric element, as shown in FIG. 4. The subassembly 60 and specifically the first surface 34 of chip 32 may be attached to the first surface 64 of dielectric element 62 using an epoxy such as encapsulant material 78. In this configuration, the contacts 18, 38 of chips 12, 32 are aligned with holes 76.

To electrically connect the subassembly 60 to the bond pads 68, a connection element such as wire leads 80 may be utilized. A first end of each wire lead 80 is attached to a single contact pad 18, 38. Each wire lead extends downwardly from a respective bond pad 18, 38 and through one of the holes 76. The opposite end of each wire lead 80 is attached to a single bond pad 68. Thus, the wire leads 80 place individual contact pads 18, 38 into electrical communication with individual bond pads 68. And since the bond pads 68 are electrically connected to the conductive posts 72, via the traces 70, the contact pads 18, 38 are also in electrical connection with the conductive posts 72. When connecting the wire leads to bond pads 68, the wire leads 80 have portions extending below the bond pads 68 and below the dielectric element 62 but not as low as the lowest ends of the conductive posts 72. The portions of the wire leads 80 below the dielectric element 62 are exaggerated in the figures so as to highlight this feature. Once the wire leads 80 have been correctly assembled, an encapsulant material 81 is disposed over the wire leads 80 to provide rigidity to the wire leads as well as to protect them from damage. The encapsulant material 81 may extend within the holes 76 and also maintains separation between adjacent wire leads 80. The encapsulant material 81 also projects below the dielectric element but not as low as the lowest ends of the conductive posts 72.

The microelectronic package 10 may also include a solder mask layer 82 disposed over various electrical conductive features as known to those in the art.

With reference to FIG. 5A, the holes 76 in the microelectronic package 10 comprise a plurality of openings, each aligned with contact portions 21, 41 of chips 12, 32, respectively. The holes 76 are large enough so that more than one wire lead 80 may extend from a respective contact 18, 38 to a respective bond pad 68. Each bond pad 68 is attached to a trace 70, which is itself attached to a conductive post 72 thereby electrically connecting a respective contact 18, 38 of a chip 12, 32 to a conductive post.

A first set 69 of conductive posts 72 is arranged adjacent edge 73 of dielectric element 62. And a second set 71 of conductive posts 72 are arranged adjacent edge 75 of dielectric element 62. By placing conductive posts 72 on both sides of holes 76, the microelectronic package 10 is balanced and can easily be mounted to an additional substrate such as a circuit panel or the like.

Microelectronic package 10 also includes a ground conductive post 72A. Ground conductive post 72A is electrically connected to a ground contact, as for instance ground contact 18A of chip 12 and ground contact 38A of chip 38. The elements are connected using ground wire leads 80A, which are both attached to a ground bond pad 68A and subsequently a ground trace 70A. The ground wire leads 80A, ground bond pad 68A, and ground trace 70A are similar to their respective non-ground counterpart elements but the ground elements enable the chips to be grounded to a ground contact pad on a circuit panel. Although not shown, a ground plate may also be provided to aid in the grounding of chips 12, 32. The ground plate may be positioned between chips 12, 32 or on top/below the chips 12, 32. In addition a single ground plate may be utilized by both chips 12, 32 or a single ground plate may be supplied for each chip.

As shown in FIG. 4, microelectronic package 10 may have a center line C which passes through a center axis of the package. The center line C is positioned between ends 73, 75 of dielectric element 62. As shown in FIG. 4, chip 12 is offset from center line C in that the chip extends more toward end 75 than toward end 73. Holes 76 is positioned between center line C and end 75.

After the microelectronic package 10 is constructed, the microelectronic package 10 may be attached to a circuit panel 90, as shown in FIG. 4. In order to attach the microelectronic package 10 to the circuit panel 90, the conductive post 72 and ground conductive post 72A of microelectronic package 10 are brought proximate to contact pads 92 exposed at a surface of the circuit panel 90. The ground conductive posts 72A is brought proximate a ground contact pad 92A. Once in proximity, an electrically conductive material such as a solder 94 may be placed between the contact pads 92, 92A and conductive posts 72, 72A so as to create an electrical connection. Even though the curved portions 77 of the wire leads 80 extend downwardly below the dielectric element 62 and even below the solder mask layer 82, the curved portions remain remote from the circuit panel 90 because of the height created between the solder mask layer 82 and circuit panel by the conductive posts 72, 72A.

Figure 5B:
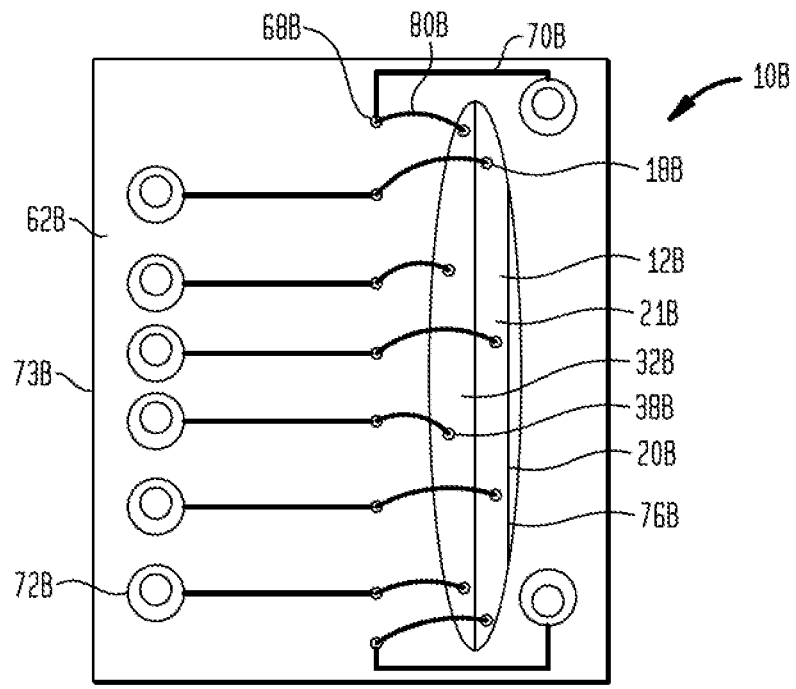

In alternate embodiments of the present invention the microelectronic package may have a different configuration. For instance, as illustrated in FIG. 5B, microelectronic package 10B is similarly constructed to microelectronic package 10 except that dielectric element 62B of microelectronic package 10B only includes a single hole 76B. The single hole 76B underlies most of the contact portions 21B, 41B of chips 12B, 32B. And all of the contacts 18B, 38B of chips 12B, 32B are exposed through hole 76B. Hole 76B extends in a longitudinal direction that is parallel to first edge 20B of chip 12B.

The single hole 76B is equivalent to the plurality of holes 76 in microelectronic package 10. Similar to microelectronic package 10, the contacts 18B, 38B of microelectronic package 10B are electrically connected to bond pads 68B by wire leads 80B. And subsequently, bond pads 68B are electrically connected to traces 70B and conductive posts 72B. By providing a single hole all of the wire leads 80B connecting contacts 18B, 38B to bond pads 68B pass through the same opening.

In addition, microelectronic package 10B differs from microelectronic package 10 in that most of the conductive post 72B are positioned remote from hole 76B and adjacent edge 73B of dielectric element 62B. Although the conductive posts 72B adjacent edge 73B are illustrated aligned with one another, they may be staggered so as to allow more conductive posts to be placed within an area.

In another aspect of the present invention, as shown in FIG. 5C, the bond pads 68C may be on both sides of hole 76C as opposed to only one side. Microelectronic package 10C, shown in FIG. 5C is similar to previous embodiments discussed herein except for the different arrangement of the conductive features disposed on the dielectric element 62C. For instance, unlike previous embodiments, the bond pads 68C of microelectronic package 10C are disposed on both sides of hole 76C thereby allowing the wire leads 80C, which connect the bond pads 68C to contacts 18C, 38C of chips 12C, 32C respectively, to extend about both sides of the hole 76C. Once again, hole 76C is can be aligned with contact portions 21C, 41C of chips 12C, 32C such that the contacts 18C, 38C are accessible. Although only two bond pads 68C are shown adjacent edge 75C of dielectric element 62C, various alternate embodiments may be constructed, which are more symmetrical.

Figure 6:
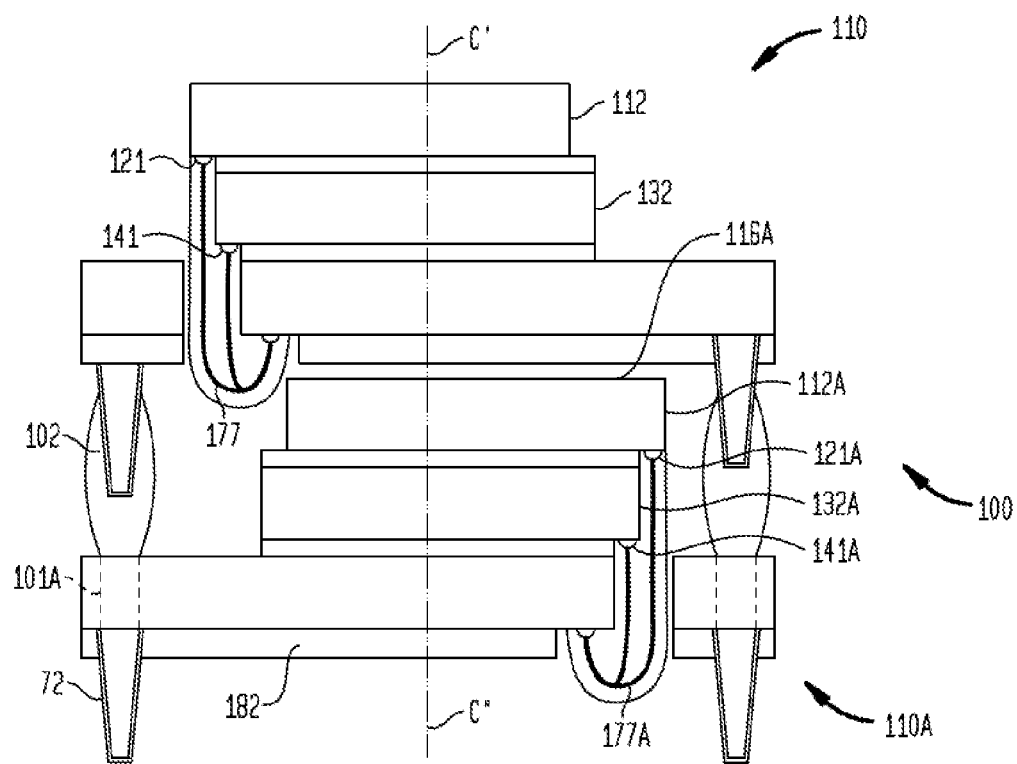
FIG. 6 is a cross-sectional view of an embodiment in accordance with the present invention.

In one aspect of the present invention, two microelectronic packages may be stacked one on top of another. For instance, a staggered stack pack 100 is shown in FIG. 6 having two microelectronic packages 110, 110A. Microelectronic packages 110, 110A are similar to microelectronic package 10 discussed herein, but additional embodiments may be used without deviating from the scope of the invention. Each of the microelectronic packages 110, 110A include a first chip 112, 112A and a second chip 132, 132A attached to the respective first chip. Each microelectronic packages 110, 110A further includes a dielectric element 162, 162A, attached to the respective second chips 132, 132A.

One difference between microelectronic packages 110 and 110A is that microelectronic package 110 is a left staggered stack package and microelectronic package 110A is a right staggered stack package. In a left staggered stack package the contact portion 121 of the top chip 112 extends outwardly beyond the left edge of the bottom chip 132. And the contact portion 141 of the bottom chip 132 is on the left of the chip. In contrast, in a right staggered stack package the contact portion 121A of the top chip 112A extends outwardly beyond the right edge of the bottom chip 132A. And the contact portion 141A of the bottom chip 132A is on the right of the chip. In addition, in a right staggered stack package 110A, holes 176A are positioned between a center line C' and end 175A of substrate 162A. Also, chip 112A is offset from the center line C' towards end 175A. But in a left staggered stack package 110, chip 112 is offset from a centerline C" toward end 173 of substrate 162 and holes 176 are positioned between centerline C" and end 173. Of course, the order of stacking may be altered.

With reference to FIG. 3, it can be observed that a right staggered stack package and a left staggered stack package may be the exact same structure. For instance, if microelectronic packages 110, 110A were both microelectronic packages 10, in a left staggered stack package edge 23 of chip 12 faces out of the page. But in a right staggered stack package edge 24 of chip 12 faces out of the page. Thus, the staggered stack pack 100 may be constructed using two identical microelectronic packages.

To create the staggered stack pack 100, microelectronic package 110 is brought proximate to microelectronic package 110A. The lower ends of conductive posts 172 of microelectronic package 110 are aligned with the top surfaces of the conductive posts 172A of microelectronic package 110A. Dielectric element 162A may include a plurality of vias 101 that expose at least part of the top surfaces of conductive posts 172A.

With reference still to FIG. 6, microelectronic package 110 may be brought proximate to microelectronic package 110A until the curved portions 177 of microelectronic package 110, which extend downwardly beyond the solder mask layer 182 of microelectronic package 110 also extend downwardly past the second surface 166A of chip 112A. Once the right and left staggered stack packages 110, 100A are in position, conductive material 102 such as solder may be disposed in and around the conductive posts 172 and into vias 101 thereby connecting the top surface of conductive posts 172A to conductive posts 172. The conductive material 102 not only electrically connects conductive posts 172 to conductive posts 172A but also provides the framework to hold the microelectronic packages 110, 110A together such that the staggered stack pack 100 is formed.

By placing a left staggered stack package 110 above (or below) a right staggered stack package 110A, the overall height of the staggered stack pack 100 may be reduced. This is because the curved portions 177 of wire leads 180 are not required to be disposed higher than the second surface 116A of chip 112A and the overall height of the "sandwich" is lessened.

Figure 6C:
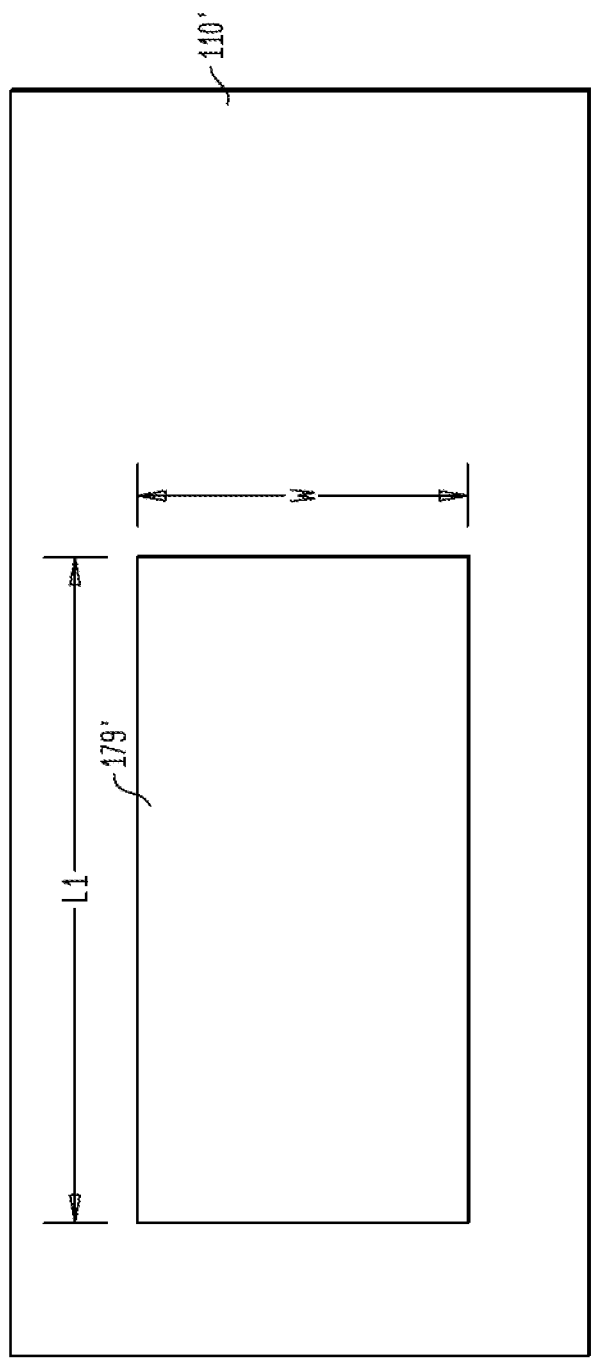
FIG. 6C is a top plan view of the embodiment shown in FIG. 6B.

Referring to FIG. 6B, a variation of the embodiment shown in FIG. 6 is illustrated. The only difference between the embodiment of FIG. 6B and FIG. 6, is that instead of only encapsulating the wire leads 177', 177A', an encapsulant or overmold 179' may be formed over both wire leads 177', 177A' and exposed surfaces of chips 112', 132', 112A', 132A'. With reference also to FIG. 6C, the overmold 179 of the left staggered package 110' may extend across an entire length L1 of the chips 112', 132', as well as the entire width W of the chips 112', 132' (FIG. 6C). Similarly, the overmold 179' deposited on the right staggered package 110A' may extend across an entire length L2 of the chips 112A', 132A', as well as an entire width (not shown) of the chips 112A', 132A. Once the overmold is formed, chips 112', 132' 112A', 132A' may be completely encapsulated such that all surfaces are covered. The overmold over the chips may help limit warping of the stack package.

It is to be understood that overmold is a form of encapsulant used to cover wire leads or the like, as well as the chips. The overmold may be formed using known methods in the art, such as by placing a mold around the desired portions of the chip package and filling the mold with an encapsulant or the like.

In an alternate embodiment, with reference to FIG. 7, either one or both of the left staggered stacked package and right staggered stack package may include pads as opposed to conductive posts. For instance, as shown in FIG. 7, right staggered stack package 210A and left staggered stack package 210 are similarly constructed as packages 110, 110A. However, in left staggered stack package 210 and right staggered stack package 210A, the conductive posts in the previous embodiment have been replaced with contact pads 272 and 272A. Contact pads 272, 272A perform similar functions as the conductive posts previously described herein and may be electrically connected to bond pads 268, 268A via traces 270, 270A. The contact pads 272, 272A do not extend downwardly or as long as the conductive posts of the previous embodiment. Therefore, when electrically connecting contact pads 272 to contact pads 272A through vias 201A in dielectric element 262A, a relatively large mass of electrically conducted material, as for instance, solder 202 must be employed. The relative size of the mass of solder 202 must be large enough to allow the chips 212A, 232A to be positioned over a circuit panel 290, but below the left staggered stacked package 210. Of course, by positioning a right staggered stack package 210A beneath a left staggered stack package 210, the overall height H between a lower surface of the solder mass layer 282 of the left staggered stack package 210 to the first face 264A of dielectric element 262A of right staggered stack package 210A is somewhat less than that which would be required if non-altering staggered stack packages were not employed.

Once the staggered stack pack 200 has been constructed by the joining of the right staggered stack package 210A to left staggered stack package 210, the staggered stack pack 200 may be attached to a circuit panel or circuit board, such a circuit panel 290. To electrically connect the staggered stack package 200 to circuit panel 290, contact pads 272A are brought in proximity to and aligned with contacts 292 of circuit panel 290. Once the two elements are aligned, a mass of electrically conductive material, such as solder 294 may be disbursed in and around both of the contact pads 272A and contacts 292 to electrically connect the two. The height of the solder 294 must be of sufficient size so that curved portions 277A of wire leads 280A, which connect on contacts 218A, 238A to bond pads 268A, remain remote from the surface of the circuit panel 290.

In an alternate embodiment, as shown in FIG. 8, the microelectronic package 310 may be constructed having a "pins in" configuration. Microelectronic package 310 includes a dielectric element 362 having a first surface 364 and an oppositely facing second surface 366. As with prior embodiments, the dielectric element 360 includes bond pads 368, traces 370 and conductive posts 372. However, the conductive posts 372 face inwardly through the dielectric element 362 as opposed to outwardly.

Microelectronic package 310 is essentially similar to previous embodiments and includes chip 312 attached to the dielectric element 362. The chip 312 includes contacts 318, which are connected to the bond pads 368 using wire leads 380. And as before, the wire leads 380 extend through holes 346 in the dielectric element 360. Although only one chip is shown, microelectronic package 310, as well as other packages discussed herein may include one, two or even more chips.

Referring to FIG. 9, in an alternative embodiment, a package is provided in which four microelectronic elements are arranged in a staggered fashion and conductively connected to the same substrate. As will be described in more detail, an overmold 494 can be disposed over both the microelectronic elements, such as microchips, and conductive connectors, such as wire leads.

Figure 12:
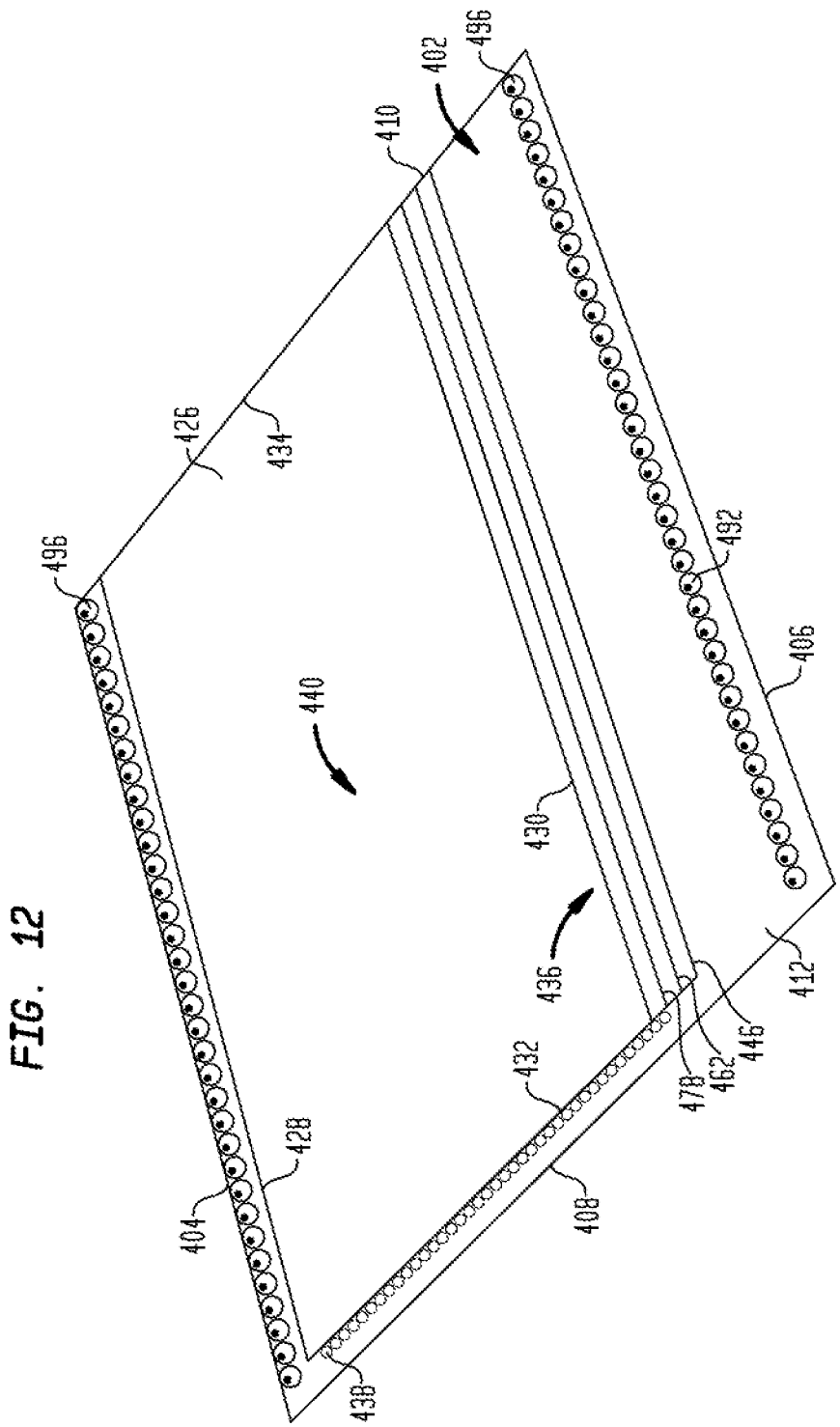
FIG. 12 is a perspective top view of several of the components of the alternative embodiment of FIG. 9.

Referring first to FIGS. 9 and 11, a microelectronic package 400 is shown in accordance with an alternative embodiment of the present invention. The microelectronic package includes substrate, including dielectric element 402 that has a first edge 404, an oppositely facing second edge 406, a third edge 408 (FIG. 12) and oppositely facing fourth edge 410 (FIG. 12). The dielectric element 402 also has a top surface 412, an oppositely facing bottom surface 414, and a hole 416 extending between the top surface 412 and bottom surface 414. Conductive elements may be exposed at both the top surface 412 and bottom surface 414 of the dielectric element 402, such as traces (not shown), conductive posts 510, solder masses such as solder balls 496, and contact pads 490. Vias 418 also extend between the top surface 412 and bottom surface 414.

Referring to FIGS. 9-12, a first chip 420, second chip 422, third chip 424, and fourth chip 426 are positioned on the top surface 412 of the dielectric element 402 in a staggered arrangement. Die attach 419 (FIG. 10) may be used to attach the first chip 420 to the top surface 412 of the dielectric element, as well as to attach each of the second, third, and fourth chips 422, 424, and 426 to the respective adjacent chip.

The fourth chip 420 may also include a top surface 425 bearing electrical contacts such as bond pads 424 exposed thereat, and an oppositely facing bottom surface 427. The fourth chip 426 also includes a first edge 428, a second edge 430, a third edge 432, and a fourth edge 434, each of the edges 428, 430, 432, 434 extending between and connecting the top surface 425 to the bottom surface 427. The bottom surface 427 of the fourth chip 426 also includes a contact portion 438 adjacent the first edge 428, a remote portion 436 adjacent the second edge 430, and a central portion 440 positioned between the contact portion 438 and the remote portion 436. Bond pads 424 are positioned adjacent the first edge 428 and the second edge 438 of the fourth chip 426.

The first, second, and third chips 420, 422, 424 can be identical to the fourth chip 426. Each of these chips 420, 422, 424 typically includes a top surface 442, 458, 474, and an oppositely facing bottom surface 443, 459, 475 bearing electrical contacts such as bond pads 424 exposed thereat. The first, second, and third chips 422, 424, 426 also respectively include a first edge 444, 460, 476, a second edge 446, 462, 478, a third edge (FIG. 12), and a fourth edge (not shown), each of the edges extending between and connecting the respective top surfaces 442, 458, 474 to the bottom surfaces 443, 459, 475. The respective bottom surfaces 443, 459, 475 of the first, second, and third chips 420, 422, 424 also respectively include a contact portion 454, 470, 486 adjacent the first edge 444, 460, 476, a remote portion 452, 468, 484 adjacent the second edge 446, 462, 478, and a central portion 440, 456, 488 positioned between the contact portion 454, 470, 486 and the remote portion 440, 456, 488. The contacts 424 are positioned adjacent the first edge 444, 460, 476 in the contact portions of the chip.

The chips are arranged in the same manner as previously disclosed herein, the only difference being the addition of the third and fourth chips 424, 426 to the package, without the need for an additional dielectric element. As best shown in FIGS. 10, 11, and 12, die attach 419 or a similar material can be disposed between the first, second, third and fourth chips 420, 422, 424, 426 to attach each of the chips 420, 422, 424, 426 together and to assemble them in a staggered arrangement, such as previously disclosed herein.

In the staggered arrangement, the first edge 428 of the fourth chip 426 is closer to the first edge 404 of the dielectric element 402, than the first edge 476 of the third chip 424. Similarly, the third chip 424 is closer to the first edge 404 of the dielectric element 402 than the first and second chips 420, 422. The chips are therefore laterally displaced or offset from one another. It follows that the second edge 446 of the first chip 420 will be closer to the second edge 406 of the dielectric element 402 than the second edges 462, 424, 478 of the second, third, and fourth chips 422, 424, 426. Similarly, the second chip 422 is closer to the second edge 406 of the dielectric element than the respective second edges 478, 438 of the third and fourth chips 424, 426. Finally, the third chip 424 is also closer to the second edge 406 of the dielectric element 402 than the fourth chip 426. Thus, the staggered arrangement of the chips 420, 422, 424, 426 can make the respective first edges 444, 460, 476, 428 of the first, second, third, and fourth chips 420, 422, 424, 426 respectively and progressively closer to the first edge 404 of the dielectric element 402. Of course, the order of stacking may be altered.

Each of the chips 420, 422, 424, 426 are positioned so that they are not encumbered. Thus, as shown in FIG. 10, the first edge 444 of the first chip 420 is positioned within the central portion 440 of the second chip 422. Similarly, each of the respective first edges 460, 476 of the second and third chips 422, 424 are adjacent the central portions 488, 440 of the directly adjacent chip or the third and fourth chips 424, 426. This configuration enables the contacts 424 of the chips to be exposed at their respective surfaces without being encumbered by additional objects.

Figure 13:
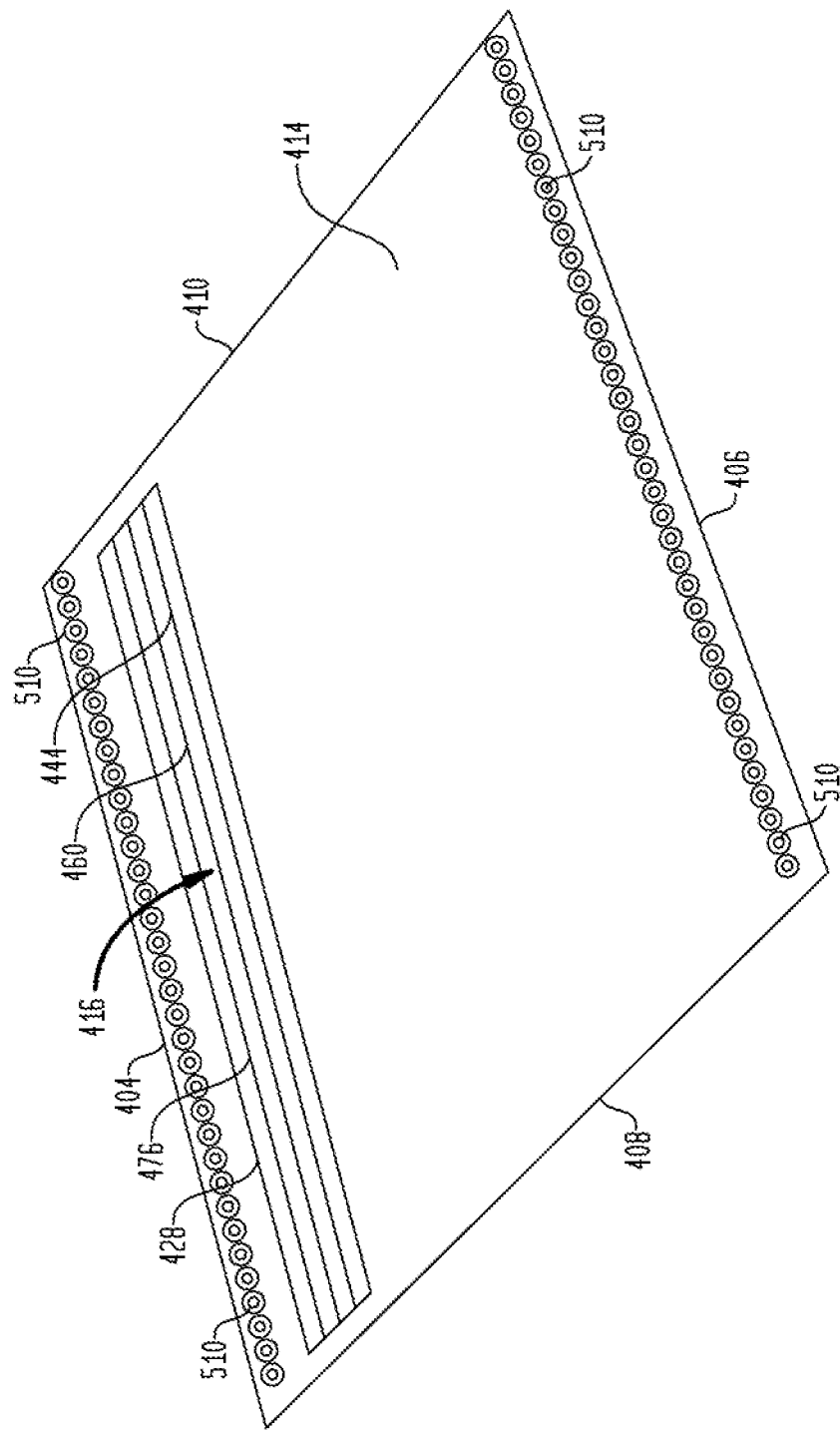
FIG. 13 is a perspective bottom view of several of the components of the alternative embodiment of FIG. 9.

Referring to FIG. 13, the staggered arrangement of the first edges 444, 460, 476, 428 of the first, second, third, and fourth chips 420, 422, 424, 426 is visible through the hole 416 when the bottom surface 414 of the dielectric element 402. As there is may only be one opening in the substrate, each of the exposed second edges 446, 462, 478, 420 of the chips 420, 422, 424, 426 is not seen in this view. It is to be understood that there may also be a plurality of openings within the dielectric element, such as previously disclosed herein.

As shown in FIGS. 9-10, to electrically connect each of the chips 420, 422, 424, 426, wire leads 492 can be used to connect bond pads 424 on each of the chips 422, 424, 426, 428 to contact pads 490 located on the bottom surface 414 of the dielectric layer 402. As all four of the chips 420, 422, 424, 426 are staggered and positioned above the hole 416, the wire leads 492 are capable of connecting to the contact pads 490 without encumbering the other wire leads 492.

Figure 14:
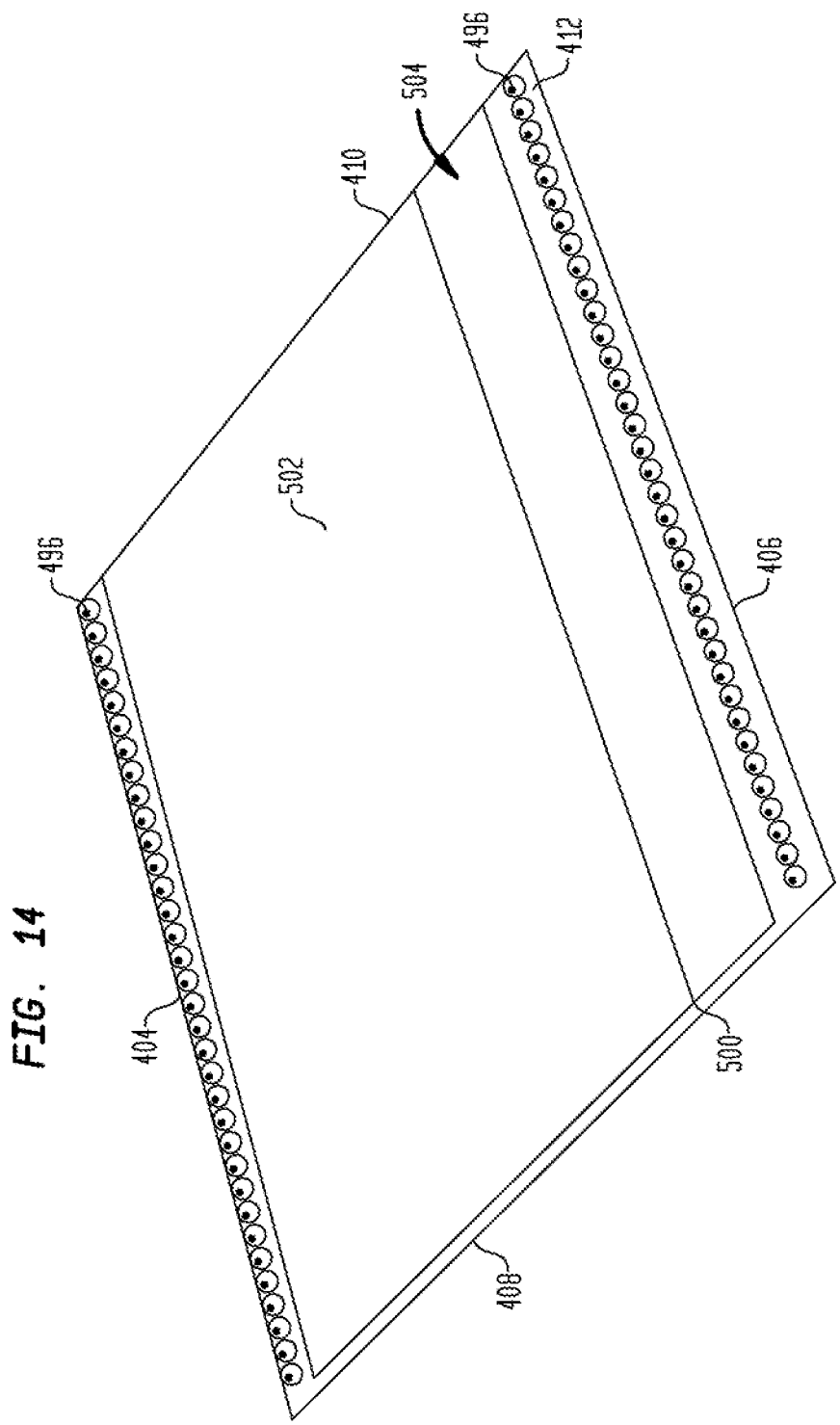
FIG. 14 is a perspective top view of the alternative embodiment of FIG. 9.

With reference to FIGS. 14-15, when the wire leads 492 are attached, an overmold 494 can be disposed over each of the chips 420, 422, 424, 426 and the respective wire leads 492. Referring to FIGS. 9, 10, 11, and 14, an overmold 494 is shown disposed across and beyond the first, second, third and fourth edges of the first, second, third, and fourth chips that are positioned on the top surface of the dielectric element. In the staggered arrangement of the chips 420, 422, 424, 426, the overmold 494 may begin adjacent to the first edge 428 of the fourth chip 426 and extend to at least adjacent the second edge 446 of the first chip 420. The overmold 494 may also extend beyond the portion of the dielectric element 402 adjacent the first chip 446, and extends to a point adjacent the solder ball 496.

As shown, the overmold 494 is not distributed over the portions of the dielectric element having solder masses, such as solder balls 496 disposed therein, such as adjacent the first and second edges 404, 406 of the dielectric element 402. Thus, the overmold 494 does not extend from the first edge 404 to the second edge 406, and only extends from the third edge 408 to the fourth edge 410 (except for the portions having the solder balls 496 disposed thereon).

In a particular embodiment, the overmold 494 decreases in thickness at the portion where the first, second, third, and fourth chips 420, 422, 424, 426 decrease in height. In other words, the decrease in thickness can occur at any point where the overmold is distributed, such as, for example, at some point where the second edges of the chips are staggered. For example, the thickness of the overmold 494 may be decreased at or near the second edge 462 of the second chip 422. This decrease in thickness creates a first step 502 between the outer left edge 498 of the overmold and the point 500 where the overmold decreases in thickness, and a second step 504 between the point 500 where the overmold decreases in thickness and the outer right edge 499 of the overmold 494. Although not required, approximately 80% of the overmold is thicker or higher than the remaining 20% which is adjacent the second edge of the dielectric element.

Referring to FIG. 10, overmold is also disposed on the bottom surface 414 of the dielectric element 402. The overmold 494 extends over the wire leads 492 that are exposed through the hole 416. The outer left edge 498 of the overmold on the bottom surface 414 is may be aligned with the outer left edge 498 of the overmold on the top surface 412 of the dielectric element 402. The outer right edge of the overmold on the bottom surface 414 may extend beyond the contact pads 490 to which the wire leads 492 are connected.

Referring to FIG. 16, a plan view showing only the profile of the overmold (without the chips) demonstrates a cross sectional profile of the package with overmolding. The first and second steps 502, 504 created on the top surface 412 of the dielectric element 402 by the overmold 498, as well as the step 512 created on the bottom surface 414 of the dielectric element 402 are illustrated.

In another aspect of the invention, as best shown in FIG. 17, a first 4-chip stack package subassembly 532 may be combined with a second 4-chip stack package subassembly 568 to form an 8-chip stack package 530. The first and second 4-chip stack packages 532, 568 may be identical to the 4-chip stack package disclosed in FIGS. 9-15, although any combination of multi-chip packages may be used in accordance with the present invention. The first subassembly 532 includes a dielectric element 536 having a hole 538 extending through the top surface 540 and bottom surface 542 of the dielectric element 536, as well as conductive elements such as traces (not shown), contact pads 544, and conductive posts 546. A chip subassembly 548 comprised of four staggered chips (first chip 552, second chip 554, third chip 556, fourth chip 558) such as the staggered arrangements disclosed herein, overlies the hole 538. To electrically connect the chip subassembly 548, wire leads 562 extend from bond pads 550 on the bottom surfaces 563 of the respective chips 552, 554, 556, 558 to the respective contact pads 544 on the bottom surface 542 of the dielectric element 502. Overmold 560 is disposed over each of the chips 552, 554, 556, 558 and the wire leads 562. As in the previously disclosed embodiments, a first step 564 and second step 566 are created by the differing mold thicknesses.

The second 4-chip stack package subassembly 568 is identical to the first 4-chip stack package subassembly 532. The second 4-chip stack package subassembly 568 also includes a dielectric element 570 having a hole 572 extending through the top surface 575 and bottom surface 572 of the dielectric element 570, as well as conductive elements such as traces (not shown), contact pads 579, and conductive posts 581. A chip subassembly 583 comprised of four staggered chips, such as the staggered arrangements disclosed herein, overlies the hole 572. Wire leads 562 also extend from bond pads 550 exposed at the bottom surfaces 585 of the respective chips 586, 588, 590, 592 to the respective contact pads 578 on the bottom surface 576, of the dielectric element 570. First and second steps 596, 598 are also created due to the differing mold thicknesses.

In both the first and second 4-chip stack package subassemblies 532, 568, an overmold 560 is disposed over both the chip subassemblies 548, 583 and wire leads 562. The overmold 560 helps to provide warpage control for the subassemblies.

To assemble the 8-chip stack package 530, the second subassembly 568 is rotated 180° with respect to the first subassembly 532. In its rotated position, the overmold 560 covering the wire leads 562 extending through the hole 572 in the second subassembly 568 is adjacent the overmold 560 covering the chip subassembly 548 positioned on the first subassembly 532.

To electrically connect the first subassembly and the second subassembly, conductive columns 580 extend between them. The conductive columns 580 are can be made in accordance with the methods that will be more fully described herein. Due to the presence of the conductive columns 580, a clearance 604 is created between the top surface 540 of the dielectric element 536 of the first subassembly 432 and the bottom surface 576 of the dielectric element 570 of the second subassembly 568. Additionally, there may be clearance 605 between the top surface 540 of the overmold above the fourth chip 558 on the first subassembly and the bottom surface 577 of the dielectric element 570 of the second subassembly 568.

The 8-chip stack package 530 can be electrically connected to a circuit board 608 by an additional layer of conductive interconnects or posts 546 extending from the bottom surface 542 of the dielectric element 536 of the first subassembly 532. The conductive posts 546 are soldered to contact pads 610 on the circuit board 608 to form a conductive column 580 using methods that will e more fully described herein.

Referring also to FIG. 18, a plan view is shown that only illustrates the profile of the overmold (i.e., without the chip subassemblies). This view demonstrates how the overmold 560 can help to provide for the staggered and interfitted arrangement of the first and second subassemblies 532, 568 so as to reduce the overall height of the 8-chip stack package 530. The bottom step 612 covering a portion of the bottom surface 576 of the second subassembly 568 is proximate the first step 564 of the overmold 560 on the top surface 540 of the first subassembly 532. Similar to the gap or opening 605, there is a gap or opening 614 created in the space between the left edge 616 of the step on the bottom surface 576 of the second subassembly 568, and the right edge 618 of the first step 564 on the top surface 540 of the first dielectric element 536. It should be appreciated that the gap may be reduced or enlarged. The first and second steps 564, 566 in the overmold 560 of the first subassembly 532 provide for an overall 8-chip stack package that is can be at least less than 1 mm or 0.98 mm.

Referring to FIG. 19, an alternative embodiment is shown. A first 4-chip stack package subassembly 630 and an identical second 4-chip stack package subassembly 632 are stacked directly on top of one another. The first subassembly 630 includes a substrate, such as dielectric element 634 having a top surface 636 and an oppositely facing bottom surface 638. The dielectric element 634 may include a plurality of conductive elements such as contact pads 640, traces (not shown), and conductive posts 642 that are exposed at either the top surface 636 or bottom surface 638 of the dielectric element 634.

A chip subassembly 644 may be comprised of a first chip 646, second chip 648, third chip 650 and fourth chip 652 are disposed above the top surface 636 of the dielectric element 634. As in the previous embodiments, the chip subassembly 644 is constructed and arranged in a staggered fashion. As shown, each of the chips 646, 648, 650 and 652 are positioned face up, such that the bond pads 654 are exposed. Wire leads 658 extend across only one edge of the chips 646, 648, 650, 652 and connect to contact pads 640 extending along the top surface 636 of the dielectric element 634. The orientation of each of the chips 646, 548, 650, 652 in the face up position eliminates the need for an opening or hole in the dielectric element for the wire leads to pass through (such as required by previous embodiments).

A second 4-chip stack package subassembly 632 having a structure like that of subassembly 630 is positioned above the first 4-chip stack package subassembly 630. As each of the chips 672, 674, 676, 678 in the chip subassembly 670 are also in a face up position, and the wire leads 658 do not extend below the top surface 662 of the second subassembly 632, the second subassembly 632 does not need to be rotated in order to be stacked on top of the first 4-chip stack package subassembly.

The resulting 8-chip stack package 680 can be connected to a circuit board 686. Conductive posts 642 extending from the bottom surface 638 of the dielectric element 634 of the first subassembly 630 are connected to contact pads 688 on the circuit board 686 using solder. The standoff or vertical height H1 of the conductive columns 656 is less than the vertical height H2 between the dielectric elements 660, 634 of the first and second subassemblies 630, 632. In the absence of a need to provide additional height to accommodate the height of the chip subassembly 644, the height of the conductive columns 656 between the first subassembly 630 and the circuit board 686 need only be large enough to accommodate the size of the conductive post 642. Alternatively, the first subassembly 630 may simply be attached to the circuit board 608 using just a solder connection, such as a solder ball (i.e., without conductive post) employing typical methods of solder attachment, such as those known in the art.

It is to be understood that in alternative embodiments of the present invention, the conductive columns are not limited to being positioned adjacent the wire leads extending from the chip subassembly (which in the previous examples is also adjacent the first and second edges of the dielectric element). The conductive columns may instead be arranged such that they are not in close proximity to the wire leads extending from the chips and adjacent the third and fourth edges of the dielectric element. For example, with reference to FIG. 19A, an alternative 8-chip stack package 680A is shown. The 8-chip stack package 680A is identical to the 8-chip stack package 680 shown in FIG. 19, the only difference being that the conductive columns 656A are positioned adjacent the third edge (facing out of the drawing figure) and fourth edge (not shown) of the dielectric elements 634A, 660A. In other words, the conductive columns 656A are not directly adjacent the contact pads 640A to which the wire leads 658A are connected. In still another alternative arrangement (not shown), the conductive columns 656A may also be arranged adjacent all four edges of the dielectric elements 634A, 668A and chip subassemblies 664A, 670A.

Figure 20:
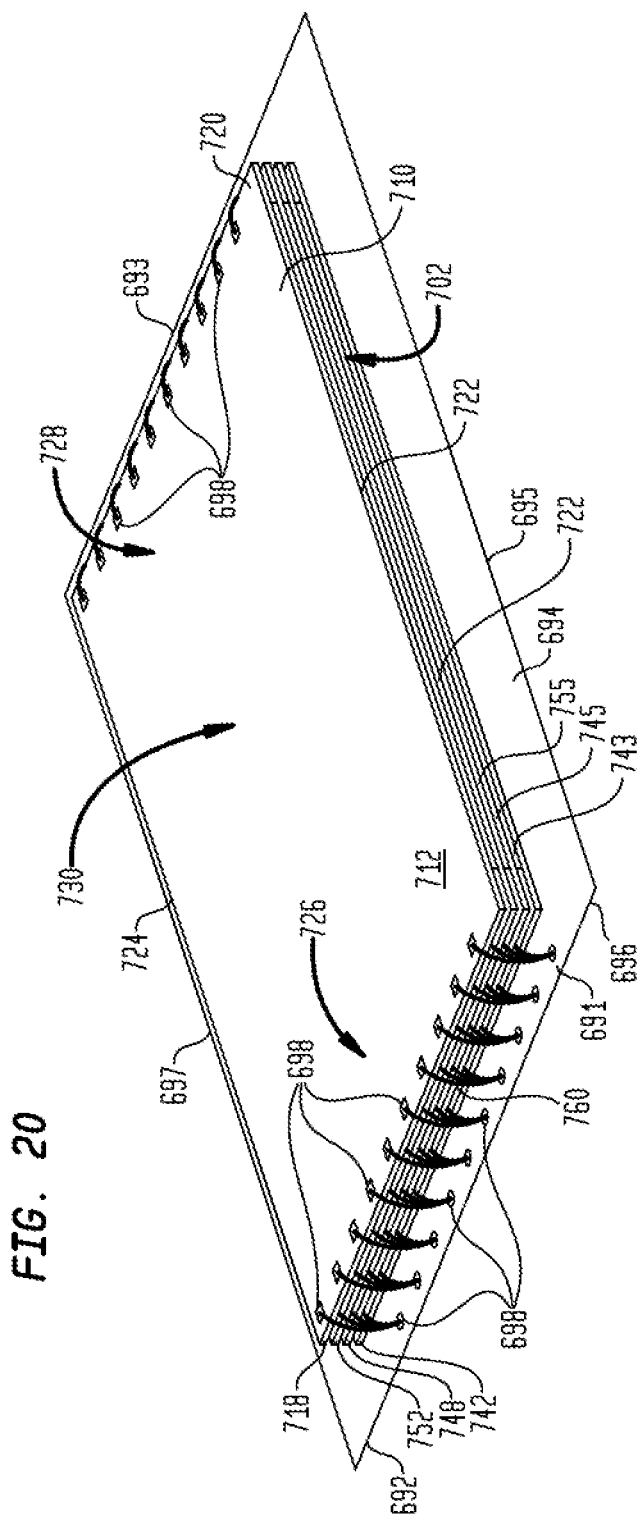
FIG. 20 is a perspective view of a portion of another alternative embodiment shown in FIG. 21.
Figure 21:
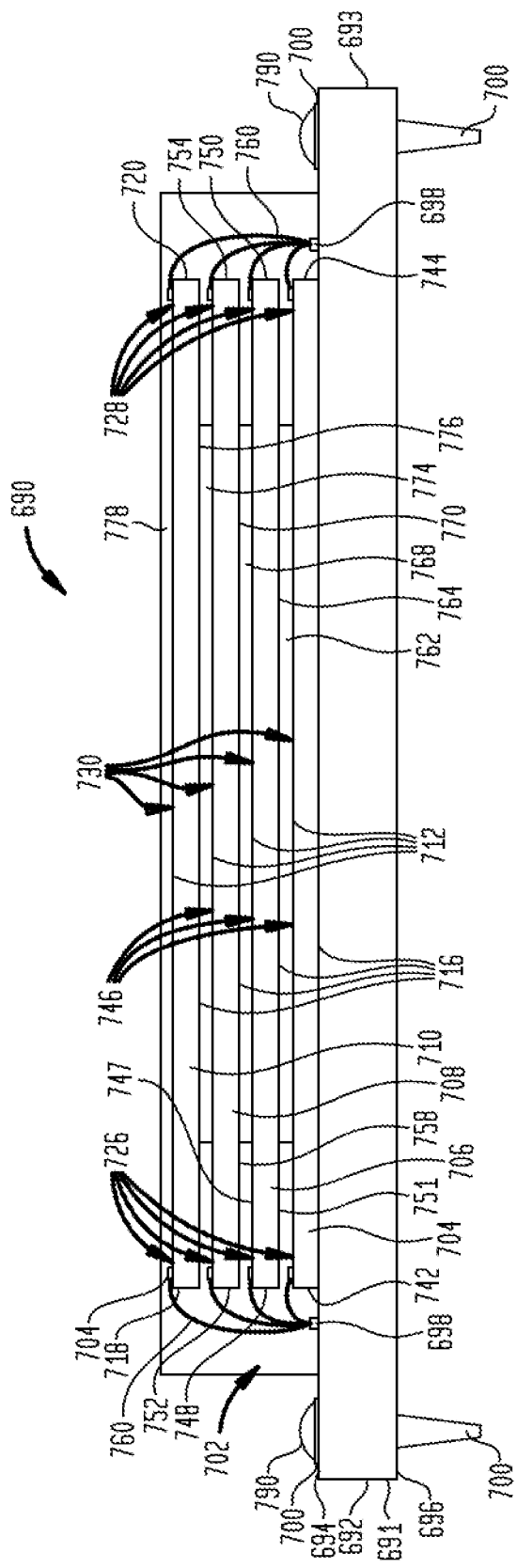
FIG. 21 is a cross-sectional view of an alternative embodiment in accordance with the present invention.
Figure 22:
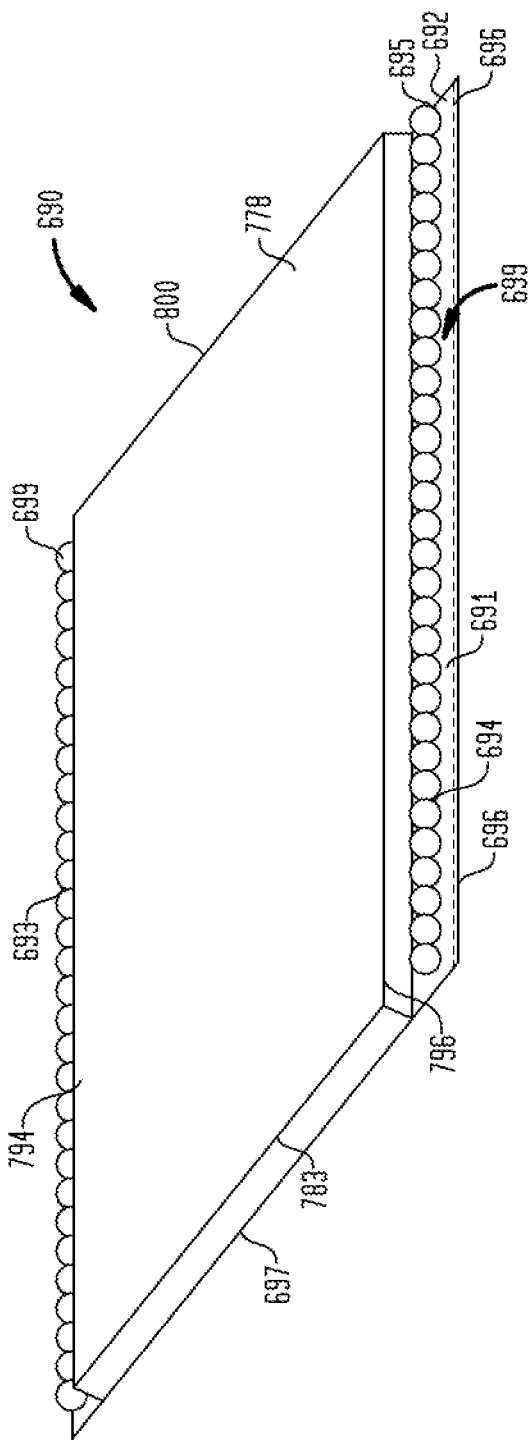
FIG. 22 is a perspective view of the alternative embodiment shown in FIG. 21.

Referring to FIGS. 20-22, an embodiment is shown including an alternative 4-chip stack package subassembly. With reference to FIGS. 20-21 (FIG. 20 showing a perspective view of the chip subassembly 702 on the dielectric element 691), the 4-chip stack package subassembly 690 includes a substrate, such as dielectric element 692 having a top surface 694 and an oppositely facing bottom surface 696. The dielectric element 692 can include a first edge 691, second edge 693, third edge 695 and fourth edge 697, as well as a plurality of conductive elements such as contact pads 698 and traces (not shown) on the top surface 694, and conductive posts 700 that are may be exposed at the bottom surface 696 of the dielectric element 692.

Like the previous embodiments, the 4-chip stack package subassembly 690 includes a chip subassembly 702 may include a first chip 704, second chip 706, third chip 708 and fourth chip 710, disposed on the top surface 694 of the dielectric element 692. Each of the chips 704, 706, 708, 710 respectively have a top surface 712 bearing electrical contacts, such as bond pads 698 exposed there at, and an oppositely facing bottom surface 716. As shown in FIG. 20, the fourth chip 710 also includes a first edge 718, a second edge 720, a third edge 722, and a fourth edge 724, each of the edges extending between and connecting the top surface 712 to the bottom surface 716. The top surface 712 of the fourth chip 710 also includes contact portions 726, 728 respectively adjacent the first edge 718 and the second edge 720, and a central portion 730 positioned between the contact portions 726, 728. The bond pads 698 are positioned adjacent the first edge 718 and the second edge 720 in the contact portions 726 of the fourth chip 710. The first, second, and third chips 704, 706, 708, 710 similarly include a contact portion 726 adjacent the respective first edges 742, 748, 752 and second edges, and a central portion 730 positioned between the contact portions 726, 728. Unlike the previous arrangements, the chips 704, 706, 708, 710 may be stacked directly on top of one another, instead of being staggered. The first edge 742 of the first chip 704 is aligned with the first edge 748 of the second chip 706. The second edge 744 of the first chip 704 is also aligned with the second edge 750 of the second chip 706. Similarly, each of the first edges 752, 718 and second edges 754, 720 of the third and fourth chips 708, 710 are may be aligned with one another, as well as in alignment with the first edges 742, 748 and second edges 744, 750 of the first and second chips 704, 706.

Each of the chips 704, 706, 708, 710 can be electrically connected to contact pads 698 aligned along and adjacent the first edge 742 and second edge 744 of the first chip 704. The contact pads 698 may also be aligned with one another, although any configuration is contemplated by the scope of the invention. Wire leads 760 extend from bond pads 714 on each of the first edges 742, 748, 752, 718 and second edges 744, 750, 754, 720 of the respective chips 704, 706, 708, 710 to the contact pads 698 on the top surface 694 of the dielectric element 692. The wire leads 760 therefore extend across each of the first edges 742, 748, 752, 718 and second edges 744, 750, 754, 720 of the respective chips 704, 706, 708, 710 and connect to the contact pads 698. In this embodiment, the wire leads 760 on the fourth chip 710 extend across the first edge 742, 748, 752 and second edge 744, 750, 754 of the first, second, and third chips 704, 706, 708. The wire leads 760 on the third chip 708 will extend across the first edges 742, 748 and second edges 744, 750 of the first and second chips 704, 706.

In order to assemble the chip subassembly 702 on the dielectric element 692, wire leads 760 must be placed on each respective chip prior to the stacking of the next chip. The first chip 704 is can be adhered to the dielectric element 692 using die attach (not shown) or the like. Once the first chip 704 is in place, the wire leads 658 are attached to the bond pads 714 on the first chip 704 and to contact pads 698 on the top surface 694 of the dielectric element 692. A spacer 762 is then placed onto the central portion 746 of the first chip 704. Any conventional spacer 762 known in the art may be used to provide a space or clearance between the first chip 704 and the second chip 706. Such spacers may include silicon or a thin polyimide, although known materials capable of spacing the chips a predetermined distance and that are capable of providing sufficient space to accommodate the wire leads 760 are acceptable. As shown, the spacer 762 does not extend to the first and second edges of the first chip 704 so as to provide sufficient space for the wire leads 760 and bond pads 714 that are adjacent the first and second edges of the respective chips. Once the spacer 762 is in place, the bottom surface 751 of the second chip 706 is positioned on the top surface 764 of the first spacer 762. Wire leads 760 may then be used to connect the bond pads 714 on the second chip 706 to the contact pads 698 on the top surface 694 of the dielectric element 692.

The third and fourth chips 708, 710 are similarly arranged. A second spacer 768 is positioned on the central region 749 of the top surface 747 of the second chip 706. The third chip 708 is then positioned on the top surface 770 of the second spacer 768. Wire leads 760 are used to connect bond pads 714 on the third chip 708 to the contact pads 698 on the top surface 694 of the dielectric element 692. Finally, a third spacer 774 is positioned on the central portion 756 of the third chip 708. The bottom surface of the fourth chip 710 is then positioned adjacent the top surface 776 of the third spacer 774. Wire leads 760 are applied to bond pads 714 on the third chip 708 to the contact pads 698 on the dielectric element 692.

Once the wire leads 760 are appropriately attached, an overmold 778 can be used to encapsulate both the wire leads 760 and the chip subassembly 702. With reference to FIGS. 21 and 22, the overmold 778 may extend from the third edge 695 of the dielectric element to the fourth edge 697 of the dielectric element. The overmold 778 may be distributed so that it does not extend across the first and second edges of the dielectric element 692. Instead, it extends from adjacent the third edges 743, 745, 755, 722 (FIG. 20) of the respective chips to adjacent the fourth edges 697 (remainder of edges now shown) of the respective chips. The overmold 778 may create a planar rectangle having first, second, third, and fourth edges 794, 796, 783, 800. In a preferred arrangement, a 4-chip stack package can have a reduced total body thickness of at least 0.4735 mm. For example, if each of the chips has a thickness of approximately 50 micrometers, each of the spacers has a thickness of 50 micrometers, the die attach is 12.5 micrometers thick and the overmold is 75 micrometers thick, the overall height of the 4-chip stack package can be 0.4375 mm.

It is to be understood that in alternative arrangements, the wire leads 760 may also extend from the third edges 743, 745, 755, 722 and/or fourth edges (not shown) of the chips (i.e., the edges of the chips that are not adjacent the solder balls) to contacts (not shown) exposed at the third and fourth edges 695, 697 of the dielectric element 692 (or the edges of the dielectric element that are not adjacent the solder balls). In such an arrangement, the only difference is that the spacers 762, 768, 774 must not extend adjacent to the third edges 743, 745, 755, 722 and/or fourth edges 724 (remainder not shown) of the respective chips so as to allow space for bond pads and wire leads that will be positioned adjacent the third and fourth edges of the chips.

Figure 23:
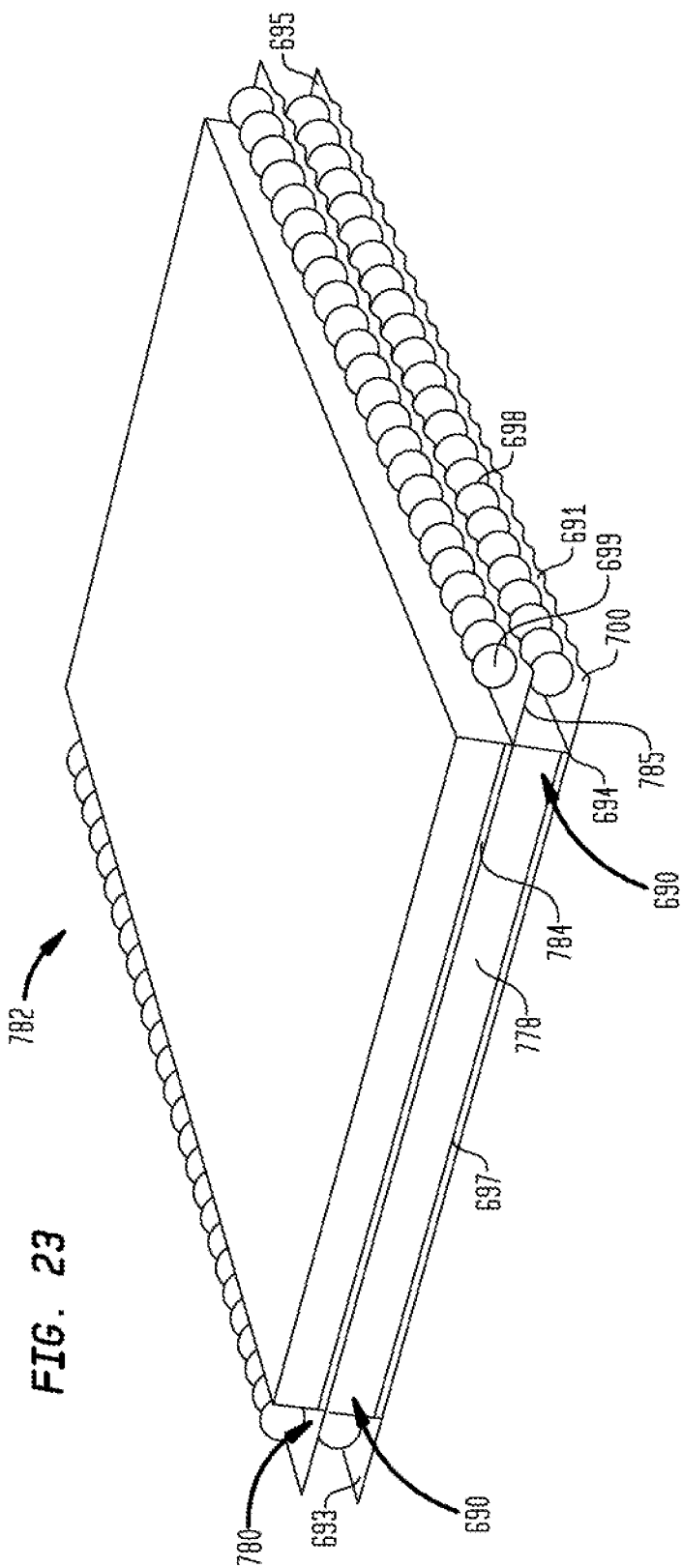
FIG. 23 is another alternative embodiment in accordance with the present invention.
Figure 24:
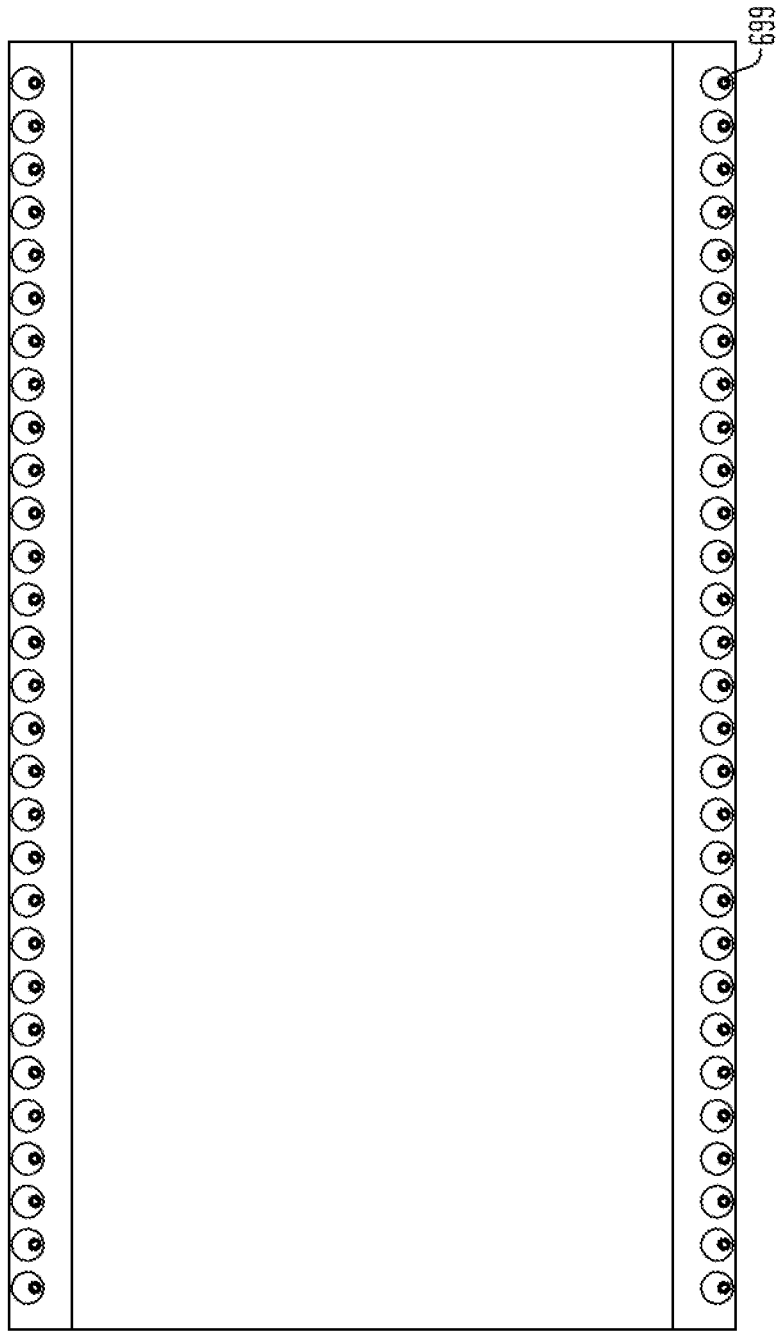
FIG. 24 is a top plan view of the alternative embodiment shown in FIG. 23.

In another aspect of the invention, with reference to FIGS. 23-25, the 4-chip stack subassembly 690 can be stacked with an identical second 4-chip stack subassembly 780 to form an 8-chip stack package 782. As the second 4-chip stack subassembly 780 is identical in shape and size to the first 4-chip stacked subassembly, it can be positioned directly above the first 4-chip stack subassembly 690. As shown in FIGS. 23 and 25, conductive posts 700 extending from the bottom surface 785 of the dielectric element 784 of the second subassembly 780 contact solder balls 699 positioned on the top surface 694 of the first subassembly 690 to form conductive columns or joints. The conductive columns or joints can be formed using methods that will be more fully described herein.

Referring to FIG. 26, the 8-chip stack package 782 may be connected to a circuit board 786. Conductive posts 700 extending from the bottom surface 696 of the dielectric element 692 of the first subassembly 690 may connect to solder balls 790 disposed on contact pads 788 on the circuit board 786 to create conductive columns 792. The conductive columns may be created using methods that will be described in more detail below. The heights of the resulting conductive column 792 between the first dielectric element 692 and the circuit board 786 is smaller than the heights of the conductive columns 792 extending between the first and second subassemblies 690, 780. The differing height is due to the need for the "standoff" or height H between the first and second subassemblies 690, 780 to be large enough to accommodate the chip subassembly 702 of the first subassembly 690.

In another aspect of the present invention, methods of forming conductive columns to achieve package-on-package stacking with increased height are disclosed. With reference still to FIG. 26, conductive columns 792 may be formed from the union of conductive posts 700 and solder. Such conductive columns 792 both increase the standoff or vertical distance between two chip packages while at the same time allowing for a decrease in the pitch or the center-to-center horizontal distance between conductive columns. The ability to increase the distance between chip packages provides the needed space to accommodate a plurality of chips on one dielectric element, such as the 4-chip stack package disclosed herein.

The dimensions of the conductive posts 700 used to help form the conductive columns 792 can vary over a significant range, but most typically the height of each conductive post above the surface of the dielectric substrate is about 50-300 μm. Such conductive posts 700 may have a height that is greater than its width.

The conductive posts may be made from any electrically conductive material, such as copper, copper alloys, gold and combinations thereof. The conductive posts may include at least an exposed metal layer that is wettable by solder. For example, the posts may be formed principally from copper with a layer of gold at the surfaces of the posts. Additionally, the conductive posts may include at least one layer of metal having a melting temperature that is greater than a melting temperature of the solder to which it will be joined. For example, such conductive posts would include a layer of copper or be formed entirely of copper.

Exemplary processes and posts are described in U.S. Pat. No. 6,884,709 and Provisional Application No. 60/875,730, the disclosures of which are incorporated herein by reference. For example, the conductive posts may be formed by etching processes. Alternatively, conductive posts may be formed by electroplating, in which posts are formed by plating a metal onto a base metal layer through openings patterned in a dielectric layer such as a photoresist layer.

Additionally, the conductive posts 700 may also take on many different shapes, including frustoconical, so that the base and tip of each post are substantially circular. The bases of the posts typically are about 100-600 μm in diameter, whereas the tips typically are about 40-200 μm in diameter. Each conductive post 700 may have a base adjacent the dielectric substrate and a tip remote from the dielectric substrate.

Referring still to FIG. 26A, the 8-chip stack package 782 (FIG. 26) is shown just prior to joining of the first 4-chip stack package subassembly 690 with the second 4-chip stack package subassembly 780. The second subassembly 780 is positioned so that conductive posts 700 extending from the second subassembly 780 are aligned with the solder balls 790 on the first subassembly 690. The conductive posts 700 may then placed in close proximity to the solder balls 790 on the contact pads 698 exposed at the top surface 694 of the dielectric element 692 of the first subassembly 690. the solder is then reflowed so that the solder wets the conductive posts 700 on the second subassembly 780. In a preferred embodiment, the conductive posts 700 contact the solder balls 790 such that at least a portion of the conductive posts is in direct contact with the reflowed solder balls 790. The conductive posts 700 need only briefly contact the reflowed solder, as the solder will then wet the exposed walls 711 and tips 713 of the entire conductive post 700. This is due to the ability of the rewetting force of the solder to overcome the surface tension on the conductive posts 700. Alternatively, substantially the entire conductive post 700 may be placed into the reflowed solder balls 790 to ensure that the solder contacts those portions of the metal posts that need to be wetted.

Figures 27, 28:
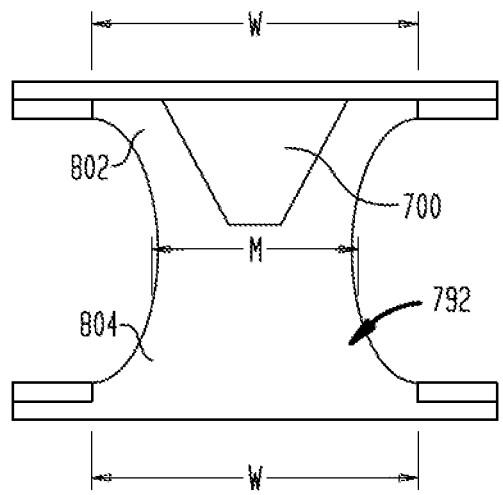
FIG. 27 is an exploded cross-sectional view of a conductive column shown in FIG. 26.
FIG. 28 is a prior art chart illustrating how the standoffs for a column of pure solder is affected by the pitch of the solder balls.

Once the solder wets the metal post, a column shaped joint or conductive column 792 (FIG. 26) is created. With reference to FIG. 27, an exploded and detailed view of the conductive column 792 of FIG. 26, conductive column 792 can be formed in the shape of an hour glass, such that the top solder region 802 contacting the conductive post 700 and the bottom solder region 804 contacting the contact pad 698 on the first subassembly 690 have greater width W than the width M of the middle region of the solder. It is to be understood that the widths W do not need to be equal, and that the height at the top solder region 802 may be greater than the bottom solder region 804 or vice versa. The conductive column 792 allows for improved package-on-package stacking due to the ability of the conductive column 806 to maintain a column of vertical solder, without requiring the need for a larger pitch between each of the conductive columns. This method of creating a conductive column may be utilized in connection with each of the embodiments of the present invention.

In typical applications using only solder connections, standoff and pitch are generally interrelated. The greater the standoff, the greater the pitch that is necessary. However, in another aspect of the invention, the creation and use of a conductive column, as described herein, (as opposed to only use of a solder ball connection) makes it possible to achieve a greater standoff with a smaller pitch. For example, as shown in the chart of FIG. 28, if a conductive post is used in connection with a solder ball having a diameter of 0.350 mm prior to reflow and stacking, a contact pad having a diameter of 0.280 mm, and a pitch between solder balls of 0.5 mm, the conductive column is capable of achieving a standoff of 0.392 mm, which is greater than half the pitch. It is to be appreciated that the following criteria was used for the information contained in FIG. 28:

ALL DIMENSIONS IN mm USING STANDARD 125 μm PIN EXCEPT FOR *80 μm
ASSUMPTIONS: FOR PITCH P, SOLDER BALL DIA. D, PAD DIAMETER d
D=0.7 P (ROUNDED TO NEAREST STD SIZE)
D=0.8 D
MAX STANDOFF VALUES CALCULATED AS THE SMALLER OF EITHER 1) THE HEIGHT OF CYLINDER SHAPE SOLDER JOINT (INCLUDING PIN VOLUME) OR 2) HEIGHT OF THE SOLDERBALL+ PIN PRIOR TO REFLOW

In comparison, with reference to FIG. 29, if a solder ball alone is used (i.e., without a conductive post), a solder ball having a diameter of 0.350 mm prior to reflow and stacking, a pad diameter of 0.280 mm, and a pitch of 0.5 mm is capable of achieving a standoff of only 0.220 mm, which is 0.175 mm shorter than the conductive column, and less than half the pitch. It is to be appreciated that the following criteria was used for the information contained in FIG. 29:

ALL DIMENSIONS IN mm
ASSUMPTIONS: FOR PITCH P, SOLDER BALL DIA. D, PAD DIAMETER d
D=0.7 P (ROUNDED TO NEAREST STD SIZE)
D=0.8 D
MAX STANDOFF VALUES CALCULATED AS HEIGHT OF COLLAPSED SOLDER BALL (SAME PAD SIZE TOP & BOTTOM)

In another aspect of the present method of providing for solder connections, a reduction in the pad size can also result in a greater standoff. For example, referring to FIG. 30, if the size of the contact pad is reduced, an even greater standoff can be achieved. It is to be appreciated that the following criteria was used for the information contained in FIG. 30:

ALL DIMENSIONS IN mm USING STANDARD 125 μm PIN EXCEPT FOR *80 μm
ASSUMPTIONS: FOR PITCH P, SOLDER BALL DIA. D, PAD DIAMETER d
D=0.7 P (ROUNDED TO NEAREST STD SIZE)
D=0.75 D
MAX STANDOFF VALUES CALCULATED AS THE SMALLER OF EITHER 1) THE HEIGHT OF CYLINDER SHAPE SOLDER JOINT (INCLUDING PIN VOLUME) OR 2) HEIGHT OF THE SOLDERBALL+ PIN PRIOR TO REFLOW

As shown, if a contact pad having a diameter of 0.280 mm is used in connection with a solder ball having a diameter of 0.350 (before reflow and stacking) and a pitch of 0.50 mm, a standoff of 0.392 mm can be achieved, which is greater than half the pitch. It is therefore possible to provide closely positioned contact pads and solder balls, and achieving a standoff height which can be sufficient to accommodate the multi-chip packages described herein (e.g., as shown in FIG. 26).

It should be appreciated that the conductive columns can be utilized in any substrate formation. For example, chip packages having as few as one chip per substrate or at least four chips per substrate may be utilized in accordance with the present invention.

Figure 31:
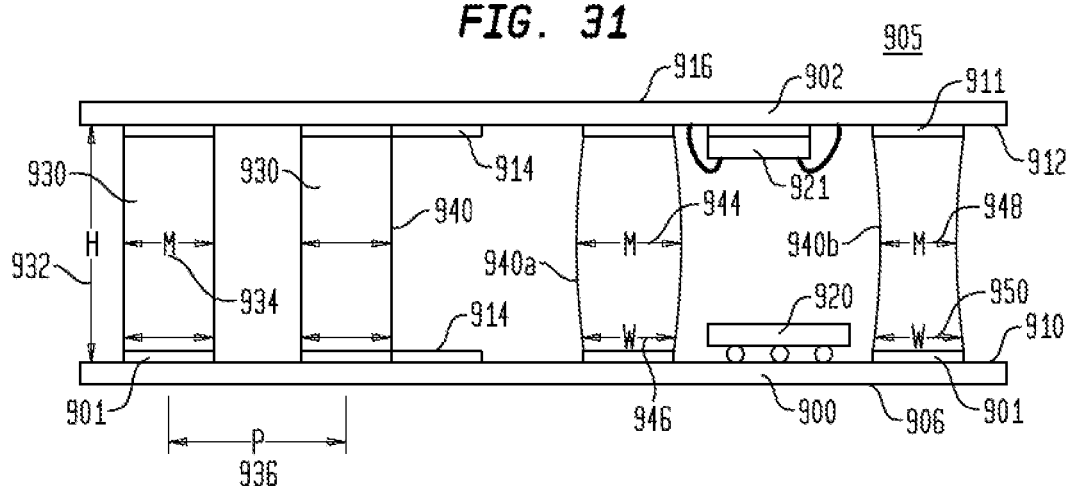
FIG. 31 illustrates a microelectronic assembly having conductive columns in accordance with another embodiment of the invention.

FIG. 31 illustrates an assembly 905 including first and second interconnect elements 900, 902, e.g., wiring elements such as chip carriers, package substrates, or already packaged microelectronic elements, lead frames, printed wiring boards, circuit panels, etc., such as suitable for interconnection of microelectronic elements, microelectromechanical elements, optoelectronic elements, and assemblies incorporating such devices. The interconnect elements 900, 902 can be of the same type or be different types. In one example, one of the interconnect elements can be a chip carrier, and another interconnect element be a circuit panel. In another example, each interconnect element includes a dielectric element having conductive features 901 exposed at least one surface of the dielectric elements. Thus, the first interconnect element 900 has a major surface 910 which defines a first plane, and conductive features 901 exposed at the major surface. The second interconnect element 902 has a major surface 912 which defines a second plane other than the first plane, with conductive features 911 exposed at such major surface 912. The first and second planes may be only generally planar. Portions of the major surfaces of the interconnect elements may not be planar. Traces 914 may extend along the respective plane away from the exposed conductive features. In yet another example, each interconnect element includes a lead frame having exposed conductive features thereon.

As shown in FIG. 31, the major surface 910 of the first interconnect element faces upward, such that it can be referred to as a top surface. The major surface 912 of the second interconnect element faces downward, such that it can be referred to as a bottom surface, the bottom surface confronting the top surface 910 of the first interconnect element. A microelectronic element 920 can be conductively connected to the first interconnect element, as shown here in a flip-chip interconnection, although it can be interconnected by other traditional means such as through wire leads. A microelectronic element 921 can also be conductively connected to the first interconnect element in either a flip-chip interconnection or traditional wire-bonded interconnection or other means. As shown in FIG. 31, the microelectronic elements 920, 921 are disposed between the confronting surfaces of the first and second interconnect elements. Alternatively or in addition thereto, microelectronic elements can be interconnected to other major surfaces such as a bottom surface 906 of the first interconnect element and a top surface 916 of the second interconnect element.

Conductive columns 930 consisting essentially of solder conductively interconnect conductive features 901 of the first interconnect element with respective conductive features 911 of the second interconnect element. The conductive features 901 typically are solder-wettable pads exposed at the respective major surfaces 910, 912. As shown in FIG. 31, the height H (932) of the conductive columns extends between the conductive pads 901, 911 to which the solder is joined. In a particular example, each column has a width M (934) at a midpoint between the respective conductive pads. The columns can be formed such that the height H (932) is greater than the width M (934). In addition, the columns can be formed such that the height 932 is greater than half the pitch P (936), as measured between the centers of adjacent columns of the assembly.

Columns can have straight walls 940, convex walls 940a, or concave walls 940b. In traditional soldered interconnections, solder masses typically have greater width at points between oppositely-facing pads to which they are joined. In one example, when a 350 μm spherical solder ball is reflowed onto a 300 μm pad, the result is a hemispherical solder bump having a maximum width such as 360 μm or greater fused to the pad. Thus, the width (360 μm) of the solder in such interconnection is greater than 1.2 times the width (300 μm) of the pad, as demonstrated by the equation 360/300>1.2. The maximum width occurs at substantial height, e.g., 100 μm or more above the pad.

In the solder columns shown in FIG. 31, the width M (944) of the slightly convex column is less than 1.2 times the width W (946) of the column 940a where joined to the conductive pad. Thus, the column may have a somewhat "barrel" shape but still assist in achieving the foregoing-described advantages of enabling a desirable standoff height without having to relax the pitch.

In another example as illustrated in FIG. 31, a column is shown having somewhat concave walls 940b. Here, the width M (948) of the column at the midpoint between opposing conductive pads 901, 911 is less than the width W (950) of the column at the conductive pad 901.

Figure 32:
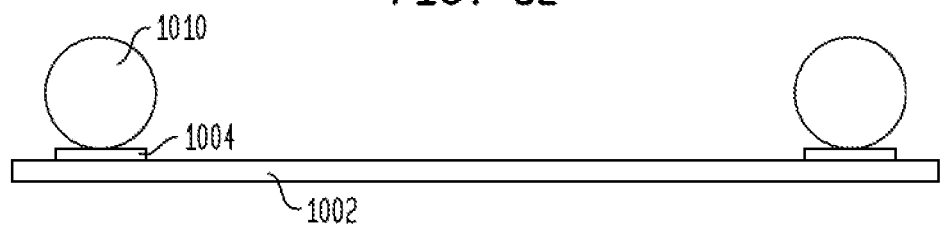
FIGS. 32 through 35 illustrate stages in a method of fabricating a microelectronic assembly as illustrated in FIG. 31.
Figure 33:
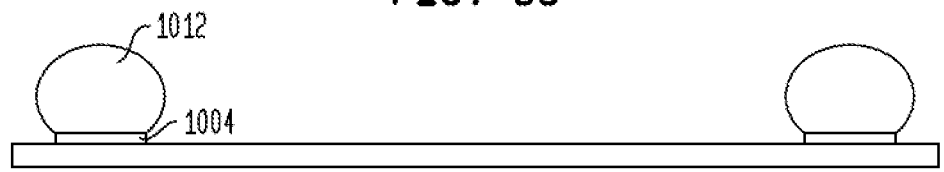
Figure 34:
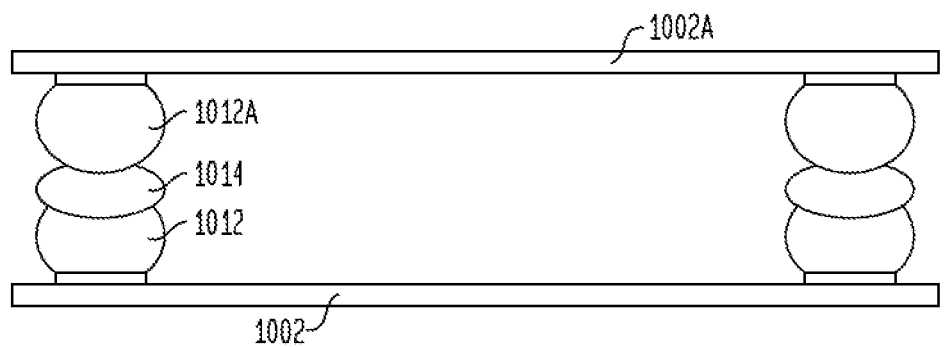
Figure 35:
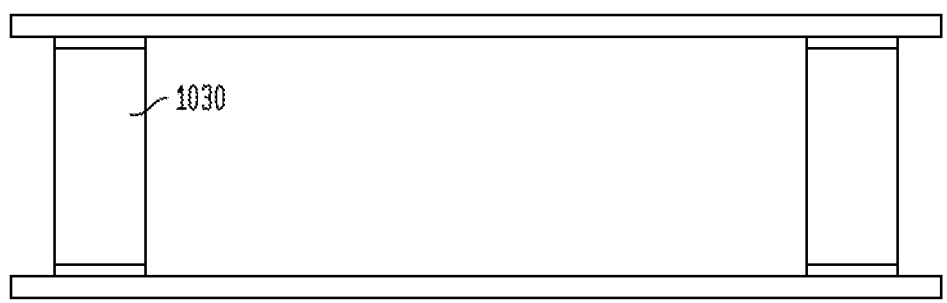

A method of conductively joining interconnect elements through conductive solder columns will now be described with reference to FIGS. 32 through 35. As illustrated in FIG. 32, solder balls 1010 (typically spheres of solder) are placed onto solder-wettable conductive pads 1004 of an interconnect element 1002 such as described above (FIG. 31). The solder balls can be placed with masses of flux on the conductive pads, after which heat is applied, causing the solder balls to reflow into hemispherical bumps 1012 which wet and fuse to the conductive pads 1004 (FIG. 33). A second interconnect element 1002A (FIG. 34) is prepared in like manner. After inverting the second interconnect element 1002A relative to the first interconnect element 1002, solder bumps 1012A of the second interconnect element 1002A are aligned with the corresponding solder bumps 1012 of the first interconnect element. A flux 1014 is provided between opposing solder bumps 1012, 1012A of each interconnect element. For example, the flux may be provided on the solder bumps 1012, 1012A of one or both of the interconnect elements prior to aligning the two interconnect elements as shown. The solder bumps on each of the interconnect elements 1002, 1002A may be brought into contact through the flux.

Subsequently, heat is applied, causing the solder of each of the bumps 1012, 1012A to fuse and form columns 1030 (FIG. 35), the columns having characteristics as described above with reference to FIG. 31.

Figure 36:
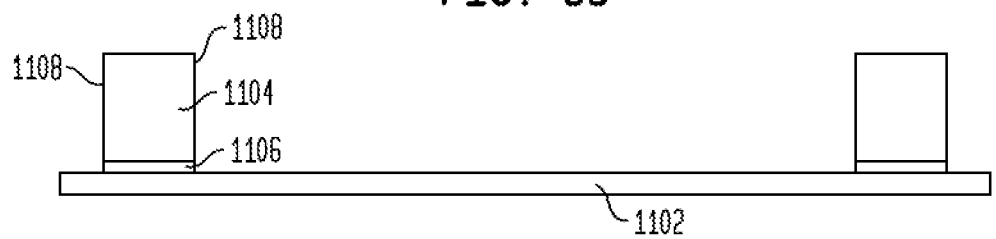
FIGS. 36-37 illustrate stages in a method of fabricating a microelectronic assembly in accordance with a variation of the embodiment illustrated in FIGS. 32-35.

Referring now to FIG. 36, in a variation of the above-described embodiment (FIGS. 32-34), masses of conductive paste 1104 are extruded onto the conductive pads 1106 of an interconnect element 1102. The masses typically are free-standing, having edges 1108 at least substantially exposed. For example, screen-printing or stencil-printing techniques can be used to force quantities of solder-containing paste through openings in a screen or a stencil onto the pads 1106. Another interconnect element 1102A (FIG. 37) is prepared in like manner and then inverted and aligned with the first interconnect element 1102. The masses 1104, 1104A of conductive paste on each of the interconnect elements 1102, 1102A may be brought into contact and heated, to form conductive columns 1030 (FIG. 30).

Figure 37:
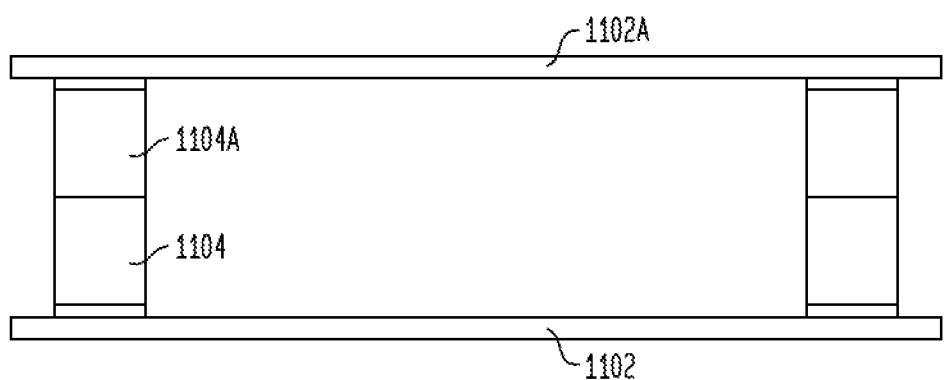
Figure 38:
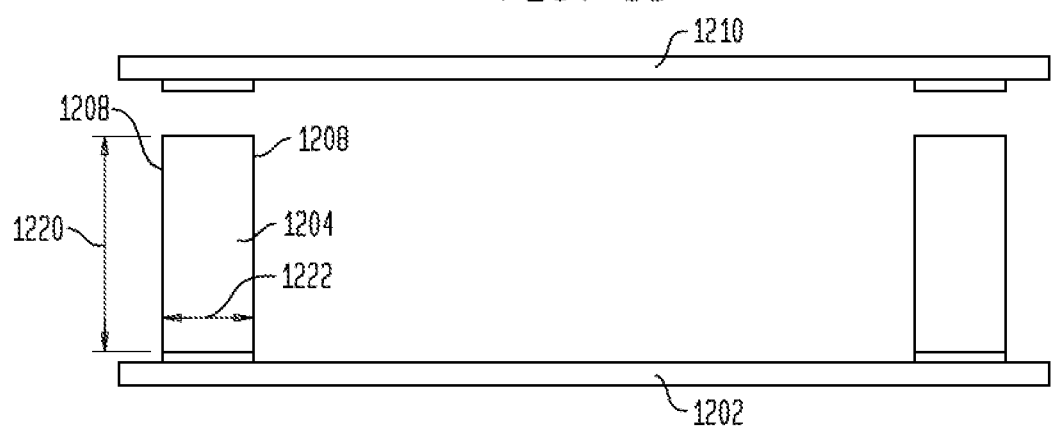
FIG. 38 illustrates a stage in a method of fabricating a microelectronic assembly according to another variation of the embodiment illustrated in FIGS. 32-35.

FIG. 38 illustrates a variation of the embodiment described with respect to FIGS. 36-37, wherein the masses 1204 of conductive paste, e.g., solder paste, are provided only on one interconnect element prior to joining the two interconnect elements. Such masses 1204 can be formed as relatively tall features having a high aspect ratio; that is, having a height H (1220) greater than the width W (1222). In a particular example, the height H may be more than 1½ times the width W, or may even be a multiple of the width. Tall masses of conductive paste can be formed using screen-printing or stencil-printing techniques. Again, masses typically are free-standing, having edges 1208 at least substantially exposed. After reflowing, conductive columns 1030 (FIG. 35) are formed which have characteristics as shown and described above.

Although the invention herein has been described with reference to particular embodiments, it is to be understood that these embodiments are merely illustrative of the principles and applications of the present invention. Accordingly, numerous modifications may be made to the illustrative embodiments and that other arrangements may be devised without departing from the spirit and scope of the present invention as defined by the appended claims.

The invention claimed is:

1. A microelectronic assembly comprising:
first and second stacked microelectronic packages, each microelectronic package comprising:
   a dielectric element having a first surface extending in a first direction, a second surface remote from the first surface, and first and second edge surfaces positioned at respective outermost first and second ends of the dielectric element, each of the first and second edge surfaces extending between the first and second surfaces in a second direction perpendicular to the first direction, the second edge surface being opposite the first edge surface in the first direction, conductive features including contact pads disposed at the second surface, and an opening extending between the first surface and the second surface, wherein the opening is closer to the first edge surface than the second edge surface;
   a first microelectronic element having a front face overlying the first surface of the dielectric element, an opposed rear face, and opposed edge surfaces extending between the front and rear faces, the first microelectronic element having a plurality of contacts aligned with the opening in the second direction;
   a second microelectronic element having a front face, an opposed rear face, and opposed edge surfaces extending between the front and rear faces, the second microelectronic element overlying the dielectric element and the first microelectronic element, the second microelectronic element having a front face and a plurality of contacts facing toward and aligned with the opening;
   terminals disposed at at least one of the first and second surfaces of the dielectric element;
   an encapsulant overlying the opposed edge surfaces of the first and second microelectronic elements and at least a portion of the first surface of the dielectric element; and
   a plurality of first and second conductive elements extending through the opening, the first conductive elements electrically connecting the plurality of contacts of the first microelectronic element with contact pads at the second surface of the dielectric element and the second conductive elements electrically connecting the plurality of contacts of the second microelectronic element with the contact pads at the second surface of the dielectric element,
wherein the dielectric element of the second microelectronic package overlies the second microelectronic element of the first microelectronic package,
wherein the first conductive element of the first microelectronic package are positioned closer to the first edge surface of the first dielectric element than the second edge surface of the first dielectric element, and wherein the conductive elements of the second microelectronic package are positioned closer to the first edge surface of the second dielectric element than the second edge surface of the second dielectric element, and
wherein the first and second microelectronic packages are stacked one on top of the other and electrically coupled to one another such that the first edge surface of the dielectric element of the first microelectronic package is aligned with the second edge surface of the dielectric element of the second microelectronic package in the second direction.

2. The microelectronic assembly of claim 1, wherein the first and second microelectronic elements of the first and second microelectronic packages are staggered in the first direction toward the respective first edge surfaces of the dielectric layers of the first and second microelectronic packages.

3. The microelectronic assembly of claim 1, further comprising conductive posts electrically connecting the first and second microelectronic packages.

4. The microelectronic assembly of claim 3, wherein the conductive posts extend from the terminals of the dielectric elements of the first and second microelectronic packages.

5. The microelectronic assembly of claim 4, wherein the conductive posts are substantially rigid metal posts.

6. The microelectronic assembly of claim 1, wherein terminals of the first and second microelectronic packages are disposed at the second surfaces of the dielectric elements of the first and second microelectronic packages, and
wherein the plurality of first and second conductive elements of the respective first and second microelectronic packages electrically connect the plurality of contacts of the respective second microelectronic elements with the contact pads of the dielectric elements of the first and second microelectronic packages.

7. The microelectronic assembly of claim 1, wherein an encapsulant extends through each of the openings of the first and second microelectronic packages.

8. The microelectronic assembly of claim 1, wherein the plurality of contacts of the first microelectronic elements of the first and second microelectronic packages are disposed adjacent the respective first edge surfaces of the first microelectronic elements of the first and second microelectronic packages.

9. The microelectronic assembly of claim 1, wherein the plurality of contacts of the second microelectronic elements of the first and second microelectronic packages face the opening in the dielectric elements of the first and second microelectronic packages.

10. The microelectronic package of claim 7, wherein the plurality of contacts of the second microelectronic elements of the first and second microelectronic packages are disposed at the front faces of the second microelectronic elements of the first and second microelectronic packages.

11. A microelectronic package comprising:
a dielectric element having a first surface, a second surface remote from the first surface, conductive features including contact pads exposed at the second surface, and an opening extending between the first surface and the second surface;
a first microelectronic element having a front face overlying the first surface of the dielectric element, such that the first surface of the dielectric layer is closer to the microelectronic element than the second surface, the first microelectronic element having a plurality of contacts aligned with the opening, a first surface, an opposed second surface, and opposed edge surfaces extending between the first and second surfaces of the first microelectronic element;
a second microelectronic element having a front face and a rear face, the second microelectronic element overlying the first microelectronic element and having a plurality of contacts aligned with the opening, a first surface, an opposed second surface, and opposed edge surfaces extending between the first and second surfaces of the first microelectronic element;
terminals exposed at at least one of the first and second surfaces of the dielectric element;
an encapsulant overlying the edge surfaces of the first and second microelectronic elements and some portions of the first surface of the dielectric element, and wherein the encapsulant does not extend over remaining portions of the first surface of the dielectric element; and
a plurality of conductive elements extending through the opening, the conductive elements electrically connecting the plurality of contacts of the first microelectronic element with contact pads disposed at the second surface of the dielectric element.

12. The microelectronic package of claim 11, wherein the terminals are exposed at the second surface of the dielectric element, and
wherein the plurality of conductive elements electrically connect the plurality of contacts of the second microelectronic element with the contact pads of the dielectric element.

13. The microelectronic package of claim 11, wherein the first microelectronic element has an outer edge, the plurality of contacts of the first microelectronic element being exposed adjacent the edge of the first microelectronic element.

14. The microelectronic package of claim 11, wherein the plurality of contacts of the second microelectronic element face the opening in the dielectric element.

15. The microelectronic package of claim 14, wherein the plurality of contacts of the second microelectronic element are exposed at the front face of the second microelectronic element.

16. The microelectronic package of claim 11, wherein conductive posts extend from the terminals.

17. The microelectronic package of claim 11, wherein the encapsulant extends through the opening.

18. A microelectronic assembly comprising:
first and second stacked microelectronic packages, each microelectronic package comprising:
a dielectric element having a first surface, a second surface remote from the first surface, conductive features including contact pads exposed at the second surface, and an opening extending between the first surface and the second surface;
a first microelectronic element having a front face overlying the first surface of the dielectric element, the first microelectronic element having a plurality of contacts aligned with the opening;
a second microelectronic element having a front face, an opposed rear face, and opposed edge surfaces extending between the first and second surfaces, the second microelectronic element overlying the first microelectronic element and the dielectric element, the second microelectronic element having a plurality of contacts disposed at the front face and aligned with the opening;
terminals disposed at at least one of the first and second surfaces of the dielectric element;
an encapsulant overlying the first and second microelectronic elements and at least a portion of the first surface of the dielectric element; and
a plurality of conductive elements extending through the opening, the conductive elements electrically connecting the plurality of contacts of the first microelectronic element with contact pads at the second surface of the dielectric element, wherein the dielectric element of the second microelectronic package overlies the second microelectronic element of the first microelectronic package, and wherein the encapsulant of the second microelectronic package encapsulates the plurality of conductive elements extending through the opening of the dielectric element of the second microelectronic package, the encapsulant of the second microelectronic package, the encapsulant having first and second opposed surfaces extending in a direction parallel to a direction the first surface of the dielectric element extends, the first and second opposed surfaces being outermost surfaces of the encapsulant, and edges extending in a second direction away from one of the first and second opposed surfaces toward the second surface, at least one of the edges of the encapsulant being laterally adjacent one of the edge surfaces of the second microelectronic element of the first microelectronic package.

19. The microelectronic assembly of claim 18, wherein the dielectric element of first microelectronic package has a first edge and a second edge, opposite the first edge in a first direction wherein the dielectric element of the second microelectronic package has a first edge and has a second end opposite the first edge of the second microelecronic package in the first direction, the first end of the first substrate and the first end of the second dielectric element being aligned proximate one another in the first direction, wherein the opening of the first substrate is adjacent the first end of the first substrate and the opening of the second substrate is adjacent the second end of the second substrate.

20. The microelectronic assembly of claim 19, wherein the opening in the dielectric element of the first microelectronic package is disposed beyond the edge of the second microelectronic element of the first microelectronic package.

21. The microelectronic assembly of claim 19, wherein the encapsulant of the second microelectronic package extends through the opening in the dielectric layer.

* * * * *